United States Patent [19]

Uchida

[11] Patent Number: 5,555,206
[45] Date of Patent: Sep. 10, 1996

[54] SEMICONDUCTOR MEMORY DEVICE

[75] Inventor: Toshiya Uchida, Kawasaki, Japan

[73] Assignee: Fujitsu Limited, Kawasaki, Japan

[21] Appl. No.: 539,107

[22] Filed: Oct. 4, 1995

Related U.S. Application Data

[63] Continuation of Ser. No. 220,914, Mar. 31, 1994, abandoned.

[30] Foreign Application Priority Data

May 20, 1993 [JP] Japan .................................. 5-118666

[51] Int. Cl.⁶ .................................................. G11C 11/24
[52] U.S. Cl. .................................... 365/149; 365/207
[58] Field of Search ...................................... 365/149, 207

[56] References Cited

U.S. PATENT DOCUMENTS

| | | | |
|---|---|---|---|
| 4,606,010 | 8/1986 | Saito | 365/149 |
| 4,916,667 | 4/1990 | Miyabayashi et al. | 365/207 |
| 4,980,864 | 12/1990 | Fukuhama et al. | 365/149 X |
| 5,051,959 | 9/1991 | Nakano et al. | 365/149 |

OTHER PUBLICATIONS

"Decoded Bit Line Structure For High Performance Sensing In Semiconductor Dynamic Memory", IBM Technical Disclosure Bulletin, vol. 29, No. 8, Jan. 1987, pp. 3379–3383.

*Primary Examiner*—David C. Nelms
*Assistant Examiner*—Son Dinh
*Attorney, Agent, or Firm*—Armstrong, Westerman, Hattori, McLeland & Naughton

[57] ABSTRACT

A semiconductor memory device includes memory cells each having a depletion-type field effect transistor and a capacitor connected in series, a bit line connected to said memory cells, an amplifier unit for amplifying the potential of the bit line, and a voltage controlling unit for limiting a voltage applied to the bit line by the amplifier unit.

16 Claims, 23 Drawing Sheets

FIG. 15

① VCC = 3.3V

② VII = 2.3V (1.15V BOTH ON "H" & "L" SIDES)

③ PRIOR ART(ENHANCEMENT)VthCell

④ PRESENT INVENTION(DEPLETION)VthCell

| STATE | CIRCUIT | CELL "0" DATA | CELL "1" DATA |
|---|---|---|---|
| STANDBY | PRIOR ART | SOURCE:CELL (0.0V) <br> DRAIN :BIT LINE (1.15V) <br> GATE :WORD LINE(0.0V) <br> SUBSTRATE:VBB (-1.0V) <br> Vgs = 0.0V <br> Vbs = -1.0V | SOURCE:BIT LINE (1.15V) <br> DRAIN :CELL (2.3V) <br> GATE :WORD LINE(0.0V) <br> SUBSTRATE:VBB (-1.0V) <br> Vgs = -1.15V <br> Vbs = -2.15V |
| STANDBY | INVENTION | SOURCE:CELL (1.0V) <br> DRAIN :BIT LINE (2.15V) <br> GATE :WORD LINE(0.0V) <br> SUBSTRATE:VSS (0.0V) <br> Vgs = -1.0V <br> Vbs = -1.0V | SOURCE:BIT LINE (2.15V) <br> DRAIN :CELL (3.3V) <br> GATE :WORD LINE(0.0V) <br> SUBSTRATE:VBB (0.0V) <br> Vgs = -2.15V <br> Vbs = -2.15V |
| READ | PRIOR ART | SOURCE:CELL (0.0V) <br> DRAIN :BIT LINE (1.15V) <br> GATE :WORD LINE(0.0V+VthCell) <br> =1.0V | SOURCE:BIT LINE (1.15V) <br> DRAIN :CELL (2.3V) <br> GATE :WORD LINE(1.15V+VthCell) <br> =2.15V |
| READ | INVENTION | SOURCE:CELL (1.0V) <br> DRAIN :BIT LINE (2.15V) <br> GATE :WORD LINE(1.0V+VthCell) <br> =1.0V | SOURCE:BIT LINE (2.15V) <br> DRAIN :CELL (3.3V) <br> GATE :WORD LINE(1.15V+VthCell) <br> =2.15V |
| WRITE | PRIOR ART | SOURCE:CELL (0.0V) <br> DRAIN :BIT LINE (0.0V) <br> GATE :WORD LINE(1.0V+VthCell) <br> =1.0V | SOURCE:BIT LINE (2.4V) <br> DRAIN :CELL (2.4V) <br> GATE :WORD LINE(2.4V+VthCell) <br> =3.4V |
| WRITE | INVENTION | SOURCE:CELL (1.0V) <br> DRAIN :BIT LINE (1.0V) <br> GATE :WORD LINE(1.0V+VthCell) <br> =1.0V | SOURCE:BIT LINE (3.3V) <br> DRAIN :CELL (3.3V) <br> GATE :WORD LINE(3.3V+VthCell) <br> =3.3V |

● : INPUT SIGNAL

○ : OUTPUT SIGNAL

5,555,206

SEMICONDUCTOR MEMORY DEVICE

This application is continuation of application Ser. No. 08/220,914 filed Mar. 31, 1994, now abandoned.

BACKGROUND OF THE INVENTION

1. Field of the Invention

The present invention generally relates to semiconductor memory devices, and more specifically, to an improvement in an operation executed from the time at which a word line is selected to the time at which information stored in a cell is output to a data line, and an improvement in a power supply related to the above operation in a dynamic random access memory device, for the purposes of increasing the operation speed and reducing power consumption.

Nowadays, semiconductor memory devices such as DRAM devices have an internal power supply, which generates an internal voltage by lowering an external power supply voltage for reduced power consumption. On the other hand, it is necessary to boost the word line voltage up over the internal power supply voltage (sometimes the external power supply voltage) in the write operation in order to store sufficient information in the cells because of reductions in the storage capacities of the cells resulting from reductions in their size.

Further, in order to retain the information written into the cells for long periods of time, it is necessary to suppress current leaks taking place in the diffusion layers connected to the storage electrodes of the cells. For this purpose, a technology for applying a negative voltage to the back gates of the cell transistors has been employed in practice.

Furthermore, an internal power supply is needed because the pre-charge voltage on the bit lines and the voltage on the cell plate (an opposed electrode) opposite to the storage electrodes are set approximately equal to half the write voltage of the cells. Actual memory devices have several internal voltage generators. Normally, the internal power supply voltages are generated by pumping or resistance division. Hence, reduction in power consumption is prevented by currents that flow in internal power supply voltage generated in the standby mode.

Generally, enhancement-type N-channel MOSFETs are used to form cells in order to increase the operation speed. In a case where the pre-charge voltages on the bit lines are half the write voltage of the cells and a 1 is stored in a cell, the information does not appear on the data line when the voltage of the word line exceeds the sum of the pre-charge voltage and the threshold voltage of the N-channel MOSFET. Originally, the loads of the word lines are heavy and prevent the high-speed operation. Hence, the threshold voltage of the N-channel MOSFET has a great impact.

2. Description of the Prior Art

FIG. 1 is a circuit diagram of the essential parts of a conventional semiconductor memory device. In this figure, n memory cells (n is an integer equal to or greater than 1) are connected to a data line 13. Each of the cells has a cell capacitor (capacitance element) 11 and an enhancement-type N-channel MOSFET (cell transistor) 12, which functions as a switching element. One end of the cell capacitor 11 is connected to the drain (source) of the corresponding cell transistor 12, and the other end thereof is connected to a reference point (set to, for example, VCC/2 where VCC denotes the power supply voltage). The source (drain) of the cell transistor 12 is connected to the data line 13, and the gate thereof is connected to a word line 16. A back-gate voltage VBB is applied to the substrate of the cell transistor 12. A differential amplifier 14 is connected to the data line 13 via an N-channel MOSFET 15, which functions as a switching element to allow a plurality of data lines 13 to share the differential amplifier 14. A selection signal BT is applied to the gate of the N-channel MOSFET 15. Hereinafter, the N-channel MOSFET 15 is referred to as a BT gate. The differential amplifier 14 performs amplification by comparing a variation in the potential of the data line 13 with the potential of the reference point.

For the sake of simplicity, let us use three power-supply voltages VCC, VSS, and VBB (VCC>VSS>VBB). A description will first be given, with reference to FIG. 2, of the operation of the differential amplifier 14 in which the amplifier 14 amplifies data "0" on the data line 13 and writes the data "0" to one memory cell. Before the write operation begins, the data line 13 is set to the reference potential (e.g., VCC/2). The power supply voltage VCC is applied to the gate of the BT gate 15 and the gate of the cell transistor 12 to be selected. This power supply voltage VCC may be either an external power-supply voltage or an internal power-supply voltage generated inside the semiconductor memory device. The differential amplifier 14 raises the potential of the data line 13 to the power supply voltage VCC and lowers the potential at the reference point to the power supply voltage VSS. Thus, the data "0" is written to the memory cell at full level. The potential of the word line 16 is decreased to the power supply voltage VSS and the selection signal BT is decreased to the power supply voltage VSS.

In the above manner, the back-gate voltage VBB which is a negative voltage lower than the power supply voltage VSS is needed to apply a reverse voltage to the memory cell in which the data "0" has been stored. As will be described later, the semiconductor memory device has an internal power supply which generates the negative voltage VBB.

FIG. 4 shows the operation of the differential amplifier 14 in which it amplifies data "1" on the data line 13 and writes the data "1" to the selected memory cell. The power supply voltage VCC is applied to the gate of the BT gate 15 and the gate of the cell transistor 12 to be selected. In this case, the data "1" cannot be written to the memory cell at full level, and the potential of the memory cell depends on the absolute value of either the threshold voltage of the BT gate 15 or the threshold voltage of the cell transistor 12. When the absolute value of the threshold voltage of the BT gate 15 is greater than that of the threshold value of the cell transistor 12, the potential of the memory cell depends on the absolute value of the threshold voltage of the BT gate 15. When the absolute value of the threshold voltage of the cell transistor 12 is greater than that of the threshold voltage of the BT gate 15, the potential of the memory cell depends on the absolute value of the threshold voltage of the cell transistor 12. Provided that the BT gate 15 and the cell transistor 12 have the same threshold voltage Vth, the potential in the memory cell rises only to VCC–Vth, as shown in FIG. 3. Thus, the difference in voltage between data "0" and "1" is VCC–Vth–VSS, i.e., VCC–Vth.

In the operation described above, the word line 16 is continuously set to the power supply voltage VSS at unselected memory cells. Therefore, the cell transistors are in the off state irrespective of whether the data in the memory cells is VSS or VCC–Vth, and are not affected at all even if the potential on the data line 13 fluctuates between VSS and VCC–Vth.

FIG. 3 is a block diagram of a conventional DRAM device having the circuit shown in FIG. 1. In FIG. 4, the DRAM device comprises an address buffer/pre-decoder 21, a row decoder 22, a column decoder 23, a sense amplifier and I/O gate 24, a memory cell array 25, a write clock generator 26, a data input buffer 27, and a data output buffer 28. Further, the DRAM device shown in FIG. 4 has clock generators 29 (No. 1) and 30 (No. 2). Furthermore, the DRAM device has an internal VCC generator 31, a VBB generator 32, a VPP generator 33, and a VPC/VPR voltage generator 34.

The address buffer/pre-decoder 21, in accordance with a timing signal (responding to a column address strobe signal/ CAS, which denotes the inverted version of signal CAS) generated by the clock generator 30, latches an external address signal and outputs a pre-decoded address signal. The row decoder 22, in accordance with a timing signal (responding to a row address strobe signal /RAS generated by the clock generator 29), receives a pre-decoded row address and selectively drives the word lines connected to the memory cell array 25. The column decoder 23, in accordance with a timing signal from the clock generator 30, receives a pre-decoded column address and selectively drives data lines connected to the memory cell array 25.

The write clock generator 26, based on a timing signal from the clock generator 30 and a write enable signal /WE, activates the data input buffer 27. Input (write) data Din from outside of the DRAM device is written into a designated memory cell via the data input buffer 27 and the sense amplifier and I/O gate 24. The data output buffer 28 is activated by a timing signal from the clock generator 30 and a timing signal from the write clock generator 26 and outputs, as Dout, data read from the memory cell array 25 to outside.

The internal VCC generator 31 outputs an internal power supply voltage (e.g., 3.3 V) from an external power supply voltage (e.g., 5 V). It should be noted that this internal power supply voltage is sometimes referred to in the specification simply as power supply voltage VCC. The internal power supply voltage VCC is distributed to various parts in the routes shown in the figure. The VBB generator 32 generates the aforementioned negative back-gate voltage VBB and outputs it to the memory cell 25. The VPC/VPR generator 34 generates voltages VPC and VPR, both of which voltages are, for example, half the internal power supply voltage VCC (VCC/2), and outputs them as pre-charge voltages to the sense amplifier and I/O gate 24 and the memory cell array 25.

The VPP generator 33 generates a voltage VPP higher than the internal power supply voltage VCC and outputs it to the row decoder 22. As shown in FIG. 2, the potential of the memory cell is VCC–Vth when data "1" is written therein. In practical terms, the larger the difference in potential between data "0" and "1", the better. Generally, the above potential difference is set equal to VCC. The voltage VPP is used to set the word line 16 and the gate of the BT gate 15 to potentials greater than VCC and turn hard on the cell transistor 12 and the BT gate 15 and to thereby set the potential of the memory cell to VCC. The voltage VPP may be, for example, VCC +Vth, in which Vth represents the threshold voltages of the cell transistor 12 and BT gate 15.

The prior-art semiconductor memory device has the following disadvantage. As shown in FIG. 3, the conventional semiconductor memory device has many internal power supplies (31–34 in FIG. 3). These internal power supplies consume large amounts of current in the standby state, and prevent reduction in power wastage and reduction in the device size.

SUMMARY OF THE INVENTION

It is a general object of the present invention to provide a semiconductor memory device in which the above disadvantage is eliminated.

A more specific object of the present invention is to provide a semiconductor memory device which has a reduced number of internal power supplies and is capable of operating at higher speeds.

The above objects of the present invention are achieved by a semiconductor memory device comprising: memory cells each having a depletion-type field effect transistor and a capacitor connected in series; a bit line connected to the memory cells; amplifier means for amplifying the potential of the bit line; and voltage controlling means for limiting a voltage applied to the bit line by the amplifier means.

BRIEF DESCRIPTION OF THE DRAWINGS

Other objects, features and advantages of the present invention will become more apparent from the following detailed description when read in conjunction with the accompanying drawings, in which:

FIG. 15 is a diagram showing the voltage conditions related to the prior art and the circuit shown in FIG. 12;

DESCRIPTION OF THE PREFERRED EMBODIMENTS

Figure 1:
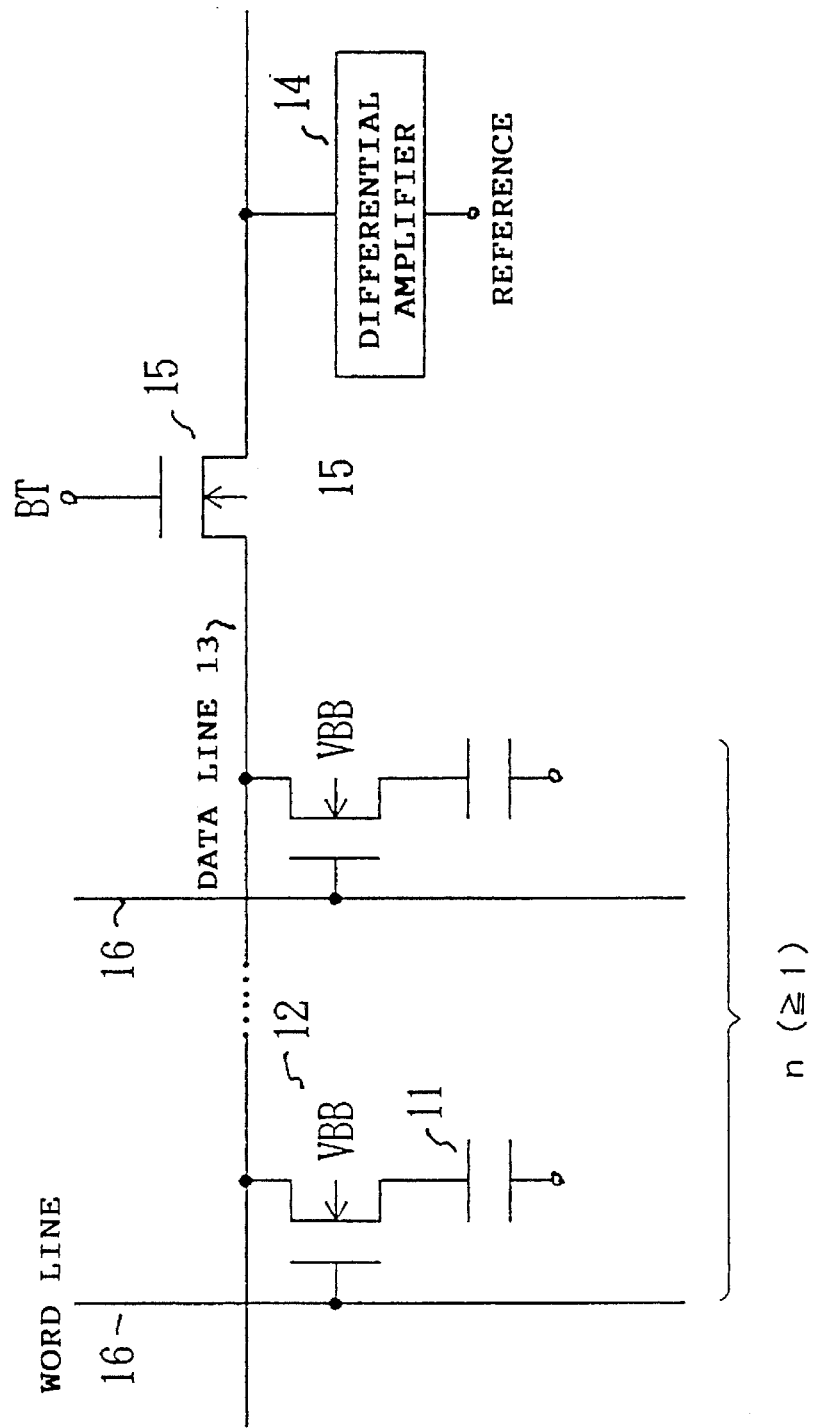
FIG. 1 is a circuit diagram of a part of a conventional memory device.
Figure 2:
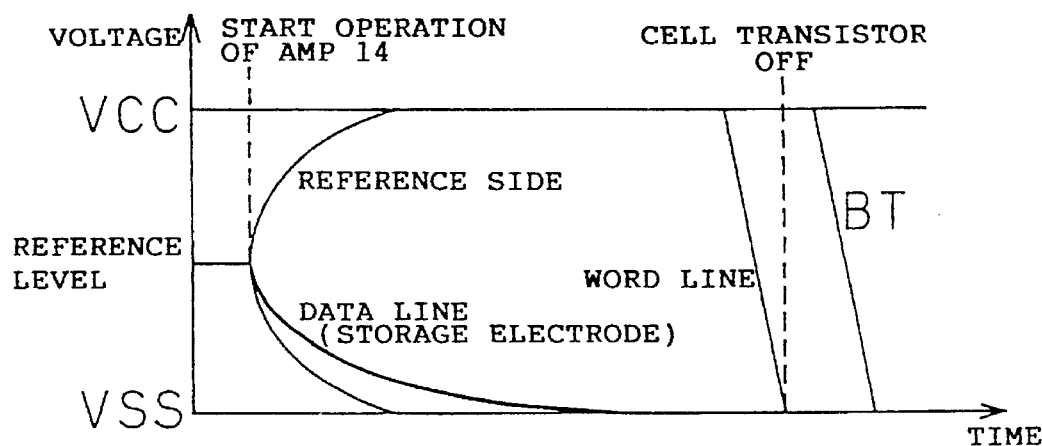
FIG. 2 is a waveform diagram of an operation of the circuit shown in FIG. 1 performed when data "0" is written into a memory cell.
Figure 4:
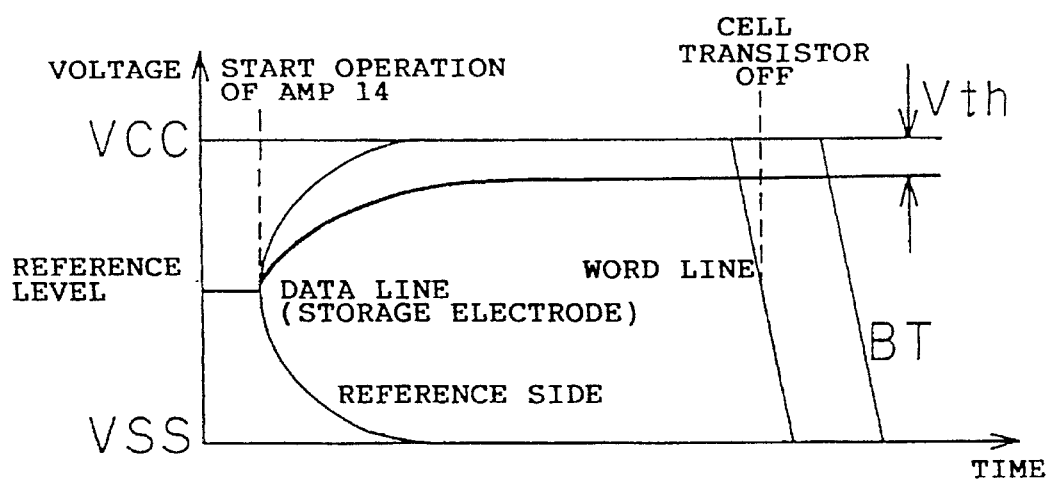
FIG. 4 is a waveform diagram of an operation of the circuit shown in FIG. 1 performed when data "1" is written into a memory cell.
Figure 3:
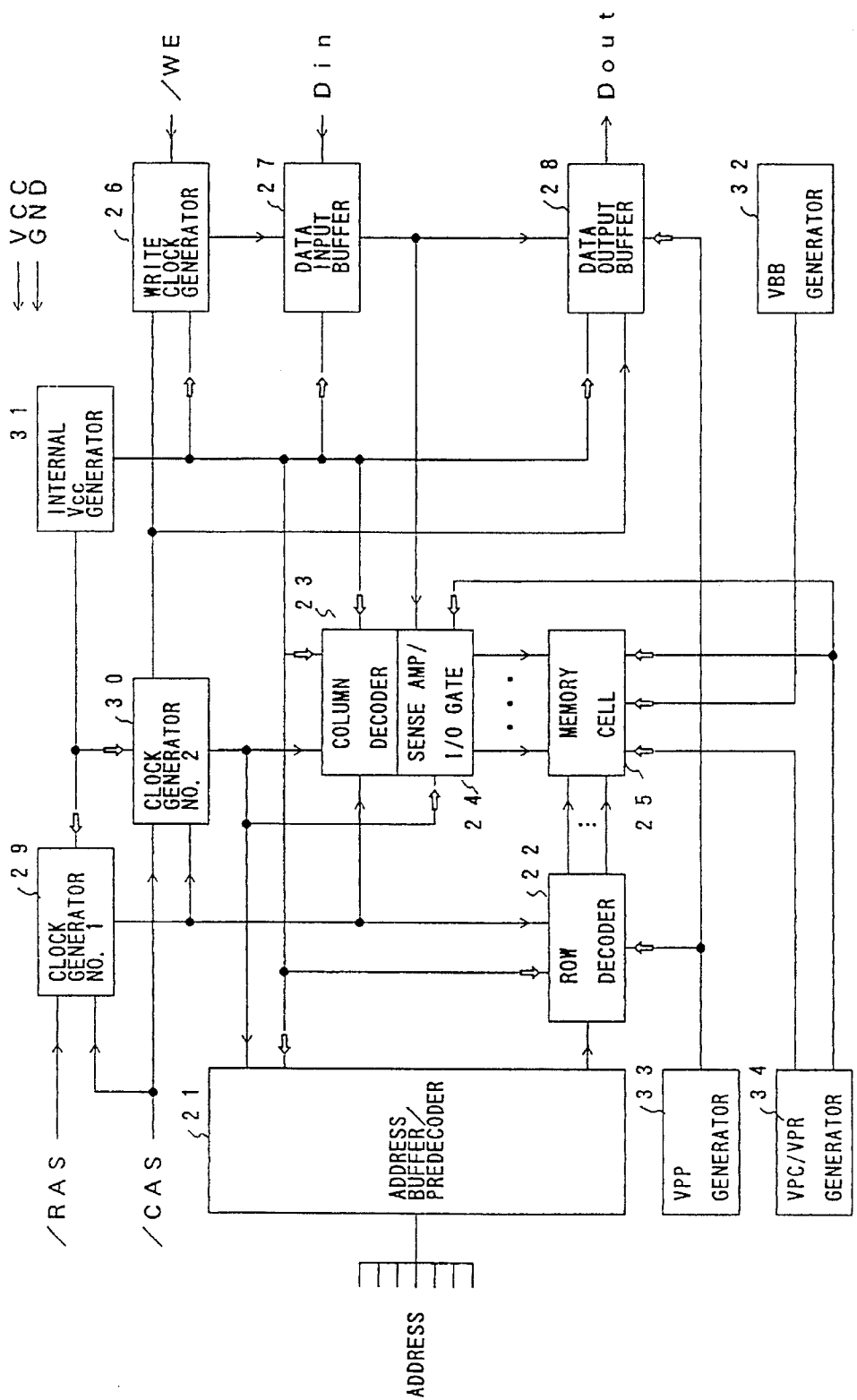
FIG. 3 is a block diagram of a conventional DRAM device having the circuit configuration shown in FIG. 1.

A description will now be given, with reference to FIG. 5, of the principle of the present invention. A semiconductor memory device shown in FIG. 5 comprises n storage elements 41 (n is an integer equal to or greater than 1) storing electrical charges representing bits of information; a switching element 42 (an N-channel MOSFET in FIG. 5) provided in common to the n storage elements 41 and selectively connecting the n storage elements 41 to a data line 43; amplification means 44 (a differential amplifier in FIG. 5) for amplifying the potential of the data line 43; voltage limiting means (45, 105) (a P-channel MOSFET in FIG. 5) which is placed between the switching elements 42 and the amplification means 44 and limits, by a specified value, either a high-potential-side voltage (voltage on the high-potential side) or a low-potential-side voltage (voltage on the low-potential side) applied by the amplification means 44 to the data line 43 and selectively supplies the limited voltage to the switching elements 42. The switching elements 42 have depletion-type MOS transistors.

Figure 5:
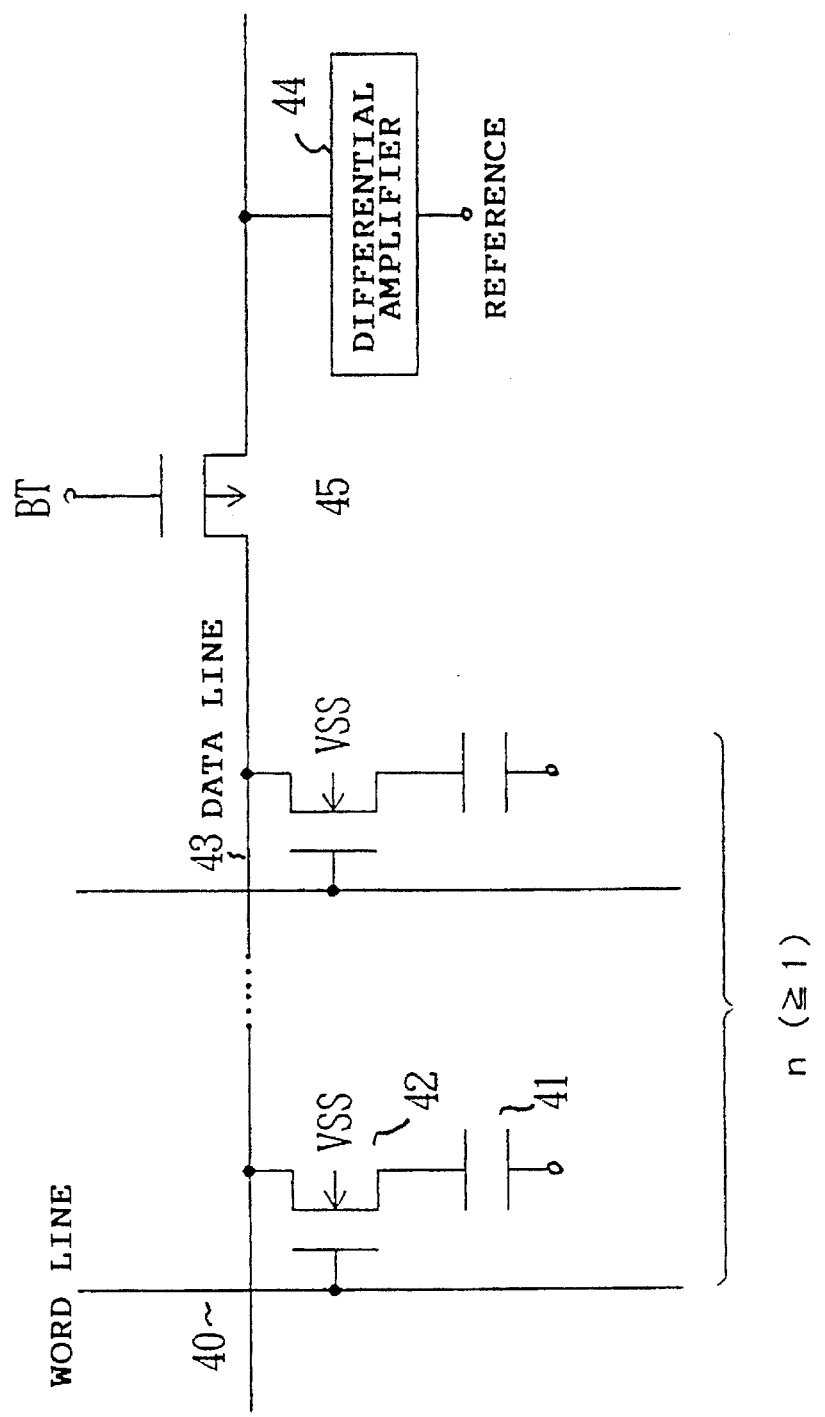
FIG. 5 is a circuit diagram of a first embodiment of the present invention.

The voltage limiting means 45, which comprises a P-channel MOSFET as shown in FIG. 5, limits the low-potential-side voltage by the specified value and applies the limited voltage to the memory cell as the voltage corresponding to data "0". Specifically, provided that the threshold voltage of the P-channel MOSFET 45 is Vthp and that the voltage on the low potential side is VSS, then a voltage of VSS+Vthp is applied to the N-channel MOSFET (cell transistor) 42 as a voltage corresponding to data "0". Writing of "1" into a memory cell is performed by applying a voltage of VCC to the memory cell, where the voltage on the high potential side is VCC.

The cell transistor 42 is a depletion-type MOSFET, and hence has a negative threshold voltage. In other words, the cell transistor 42 is turned on when the potential of the word line 40 rises to the sum of the pre-charge voltage of the word line and the threshold voltage Vthn of the cell transistor 42.

From the above, the following can be found. First, at the time of writing data "0", the voltage VSS +Vthp is applied to the cell transistor 42. If the back-gate voltage of the cell transistor 42 is set to VSS, the junction part between the drain (the storage electrode of the cell capacitor 41) and the substrate is reverse biased. This eliminates the need both for the negative back-gate voltage VBB, which is required by the prior-art semiconductor memory device, and for the internal power supply needed to generate the backgate voltage VBB.

Second, the power supply voltage from the differential amplifier 44 passes through the MOSFET 45 and is applied to the cell transistor 42. Hence, it is not necessary to boost up the word line 40 to a value equal to or higher than the power supply voltage VCC, so that the boost-up internal power supply is not needed.

Third, when the voltage of the word line 40 (the word line pre-charge voltage) becomes equal or higher than +Vthn, the cell transistor is turned on, whereby data "1" can be read therefrom at high speed.

A description will now be given, with reference to FIG. 5, of the first embodiment of the present invention.

The circuit configuration shown in FIG. 5 has a feature in which the cell transistor 42 is formed with a depletion-type N-channel MOSFET and the BT gate 45 is formed with a P-channel MOSFET 45.

In FIG. 5, n memory cells (n is an integer equal to or greater than 1) are connected to the data lines 43. Each of the memory cells has a cell capacitor (capacitance element) 41 and the depletion-type N-channel MOSFET 42 (cell transistor), which functions as a switching element. One end of the cell capacitor 41 is connected to the drain (source) of the corresponding MOSFET 42, and the other end thereof is connected to the reference point equal to half the data line amplitude, for example, VCC/2. The source (drain) of the MOSFET 42 is connected to the data line 43, and the gate thereof is connected to the word line 40. The power supply voltage VSS is applied as a back-gate voltage to the substrate of the MOSFET 42. The differential amplifier 44 is connected to the data line 43 via the P-channel MOSFET (BT gate) 45, which functions as a switching element to allow a plurality of data lines 43 to share the differential amplifier 44. The gate of the BT gate 45 is supplied with the selection signal BT. The differential amplifier 44 performs amplification by comparing the varying potential of the data line 43 with the potential of the reference point.

Figure 6A:
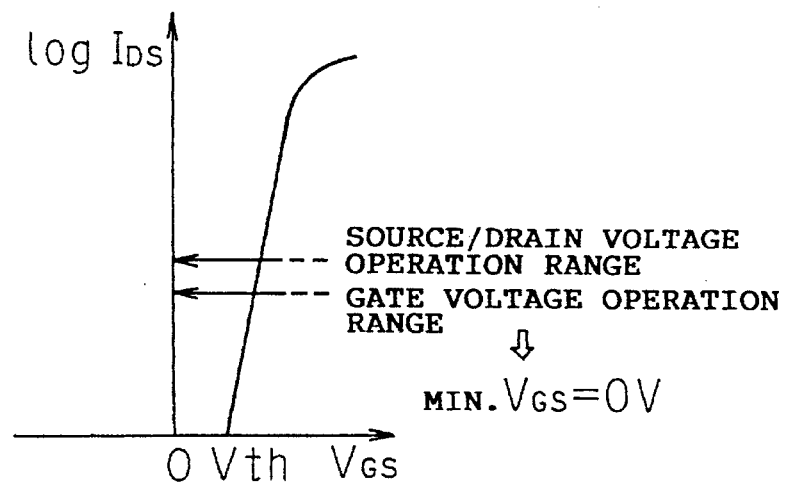
FIGS. 6A and 6B are graphs of the characteristics of an enhancement-type MOS transistor and a depletion-type MOS transistor.
Figure 6B:
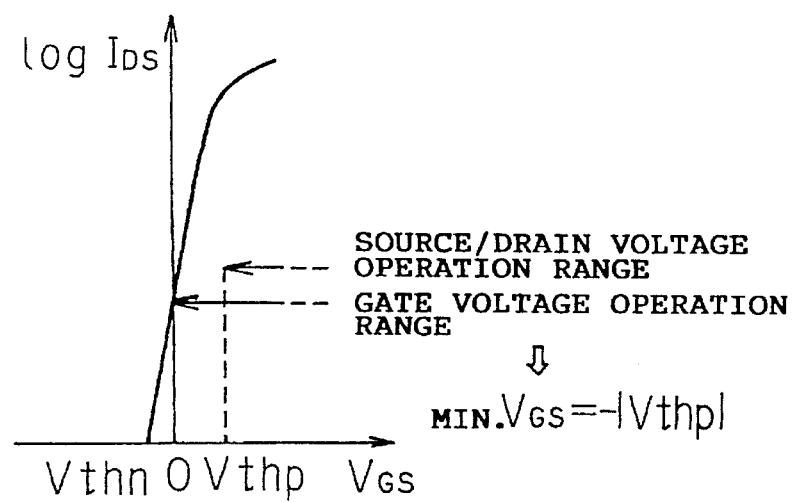

FIG. 6A shows the operational characteristics of enhancement-type MOSFETs, and FIG. 6B shows those of depletion-type MOSFETs. Each of these figures shows the gate potential VGS with respect to the source voltage on the horizontal axis and the drain current on a logarithmic scale on the vertical axis. As shown in FIG. 6A, enhancement-type MOSFETs have a positive threshold voltage and depletion-type N-channel MOSFETs have a negative threshold voltage.

A description will now be given, with reference to FIGS. 7 and 8, of the operation of the semiconductor memory device shown in FIG. 5.

Figure 7:
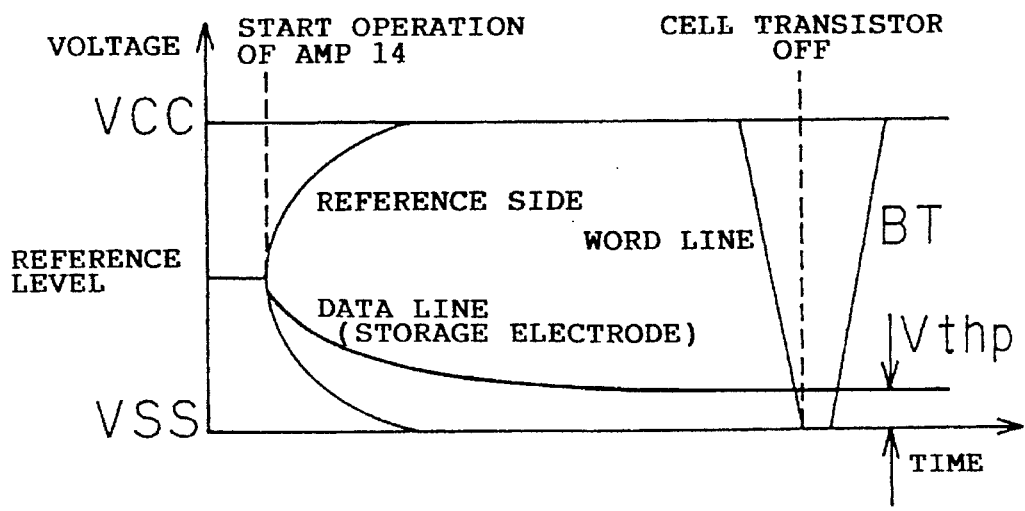
FIG. 7 is a waveform diagram of an operation of the circuit shown in FIG. 5 performed when data "0" is written into a selected memory cell.

Let us first refer to FIG. 7 and explain the operation performed when data "0" is amplified on the side of the data lines 43 (set to the power supply voltage VSS) and is written into a selected data cell. At the time of the write operation, the data line 43 is at a reference potential (e.g., VCC/2). The selection signal BT having the power supply voltage VSS is applied to the BT gate 45, and the word line 40 to be selected is set to the power supply voltage VCC. Here, provided that the threshold voltage of the BT gate 45 is Vthp, the potential of the selected memory cell (the source potential of the cell transistor 42) is dependent on the threshold voltage Vthp of the BT gate 45 and cannot drop any further than VSS+Vthp. To apply a reverse voltage to this memory cell, a potential equal to or lower than VSS +Vthp will be sufficient. In FIG. 5, the power supply voltage VSS is supplied to each of the cell transistors as a back-gate voltage. This eliminates the need both for the negative back-gate voltage VBB, which is required by the prior-art semiconductor memory device, and for the internal power supply used to generate the back-gate voltage.

Figure 8:
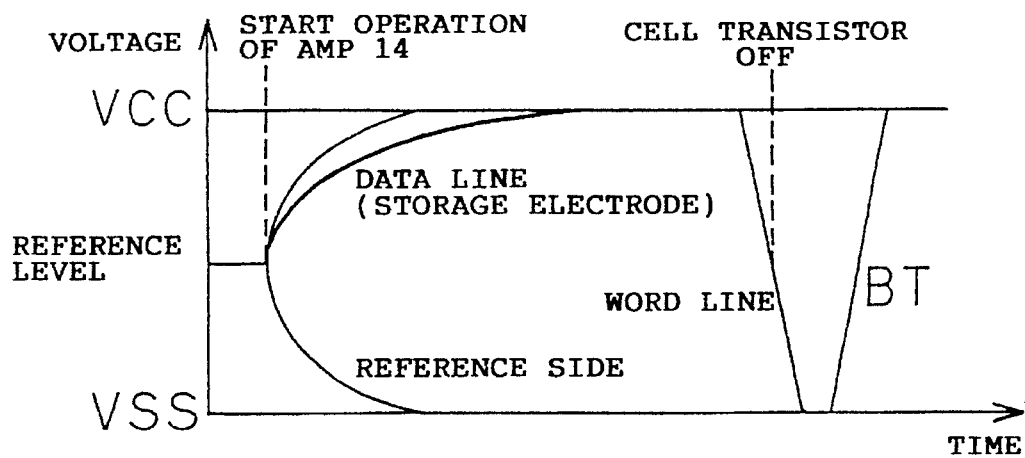
FIG. 8 is a waveform diagram of an operation of the circuit shown in FIG. 5 performed when data "1" is written into a selected memory cell.

Next, let us refer to FIG. 8 and explain the operation executed when data "1" is amplified on the side of data lines 43 (set to the power supply voltage VCC) and is written to a selected memory cell. The gate voltage of the BT gate 45 is set to the power supply voltage VSS, and the gate voltage of the cell transistor 42 to be selected (the potential of the word line 40) is set to the power supply voltage VCC. Here, the cell transistor 42, which is a depletion-type MOSFET, has a negative threshold voltage Vthn. Thus, the cell transistor 42 supplies the power supply voltage VCC of the data line 43 to the cell capacitor 41. As a result, the potential of the storage electrode of the cell transistor 41 is increased to the power supply voltage VCC.

Therefore, the potential difference between data "0" and "1" is VCC–(VSS +Vthp), i.e., VCC–Vthp. This potential difference is approximately equal to the potential difference obtained in the prior-art semiconductor memory device. The first embodiment of the present invention can thus obtain the same potential difference as previously without a VBB generator.

Further, since the word line 40 is continuously set to the power supply voltage VSS in unselected memory cells, the cell transistor 42 is kept in the off state under the condition that |Vthp|≧|Vthn|, irrespective of whether the data in the memory cell is VSS+Vthp or VCC. Thus, the unselected memory cells are not affected by any fluctuations between VSS +Vthp and VCC in the data line 43, as long as the condition |Vthp|≧|Vthn| is met.

As explained above, the first embodiment of the present invention does not require a VBB generator as an internal power supply, and this helps to reduce power consumption.

In actual semiconductor memory devices, the greater the difference in potential between data "0" and "1" the better For this reason, the potential difference is set to VCC. As has been described previously, with the prior-art semiconductor memory device, the voltage of the word line and the gate voltage of the BT gate are boosted up to VCC+Vth (Vth denotes the threshold voltages of the cell transistor 12 and the BT gate 15) in order to apply the full level of VCC to the storage electrode to ensure that the writing level data "1" is not limited. This necessitates a voltage generator for generating the voltage VCC+Vth. Since the writing level for data "0" is equal to VSS, there is also a need for a voltage generator generating a negative voltage VBB applied to the memory cells as a reverse voltage. Furthermore, the voltage forwardly applied to the gate of the cell transistor is VCC+ Vth, and a strong electric field is applied to the transistors, reducing the reliability of the device.

In the above-mentioned first embodiment of the present invention, the full level (VSS) is used to write data into the memory cell by lowering the gate voltage of the BT gate 45 to VSS–Vth to prevent the writing level for data "0" from being limited. As shown in FIG. 8, the writing level for data "1" is VCC, and hence the potential difference between data "0" and "1" is equal to VCC. What is required here is a voltage generator for generating the voltage VSS–Vthp (Vthp denotes the threshold voltage of the BT gate). This voltage, VSS–Vthp, can also be used as the back-gate voltage VBB. Hence, whereas prior-art semiconductor memory devices require two different voltage generators to generate VBB and VCC+Vth, the first embodiment of the present invention requires a single voltage generator that generates VSS–Vthp. Reduced power consumption is thus achieved. In this case, the voltage applied to the gate of the cell transistor 42 is VCC in the positive direction and Vthp in the negative direction. The divided voltage results in a weaker electric field, improving the reliability of the device. This is another benefit of the present invention.

Also, regarding the improvement in the operation speed, the worst condition during the period from the time at which the potential on the word line 40 rises to the time at which the cell transistor 42 is switched on (when data "1" is retained in the cell) is improved as a result of changing the pre-charge voltage +Vth (positive value) in the prior art to the precharge voltage+Vthn (negative value) in this invention. Hence, the access speed can be increased.

Figure 9:
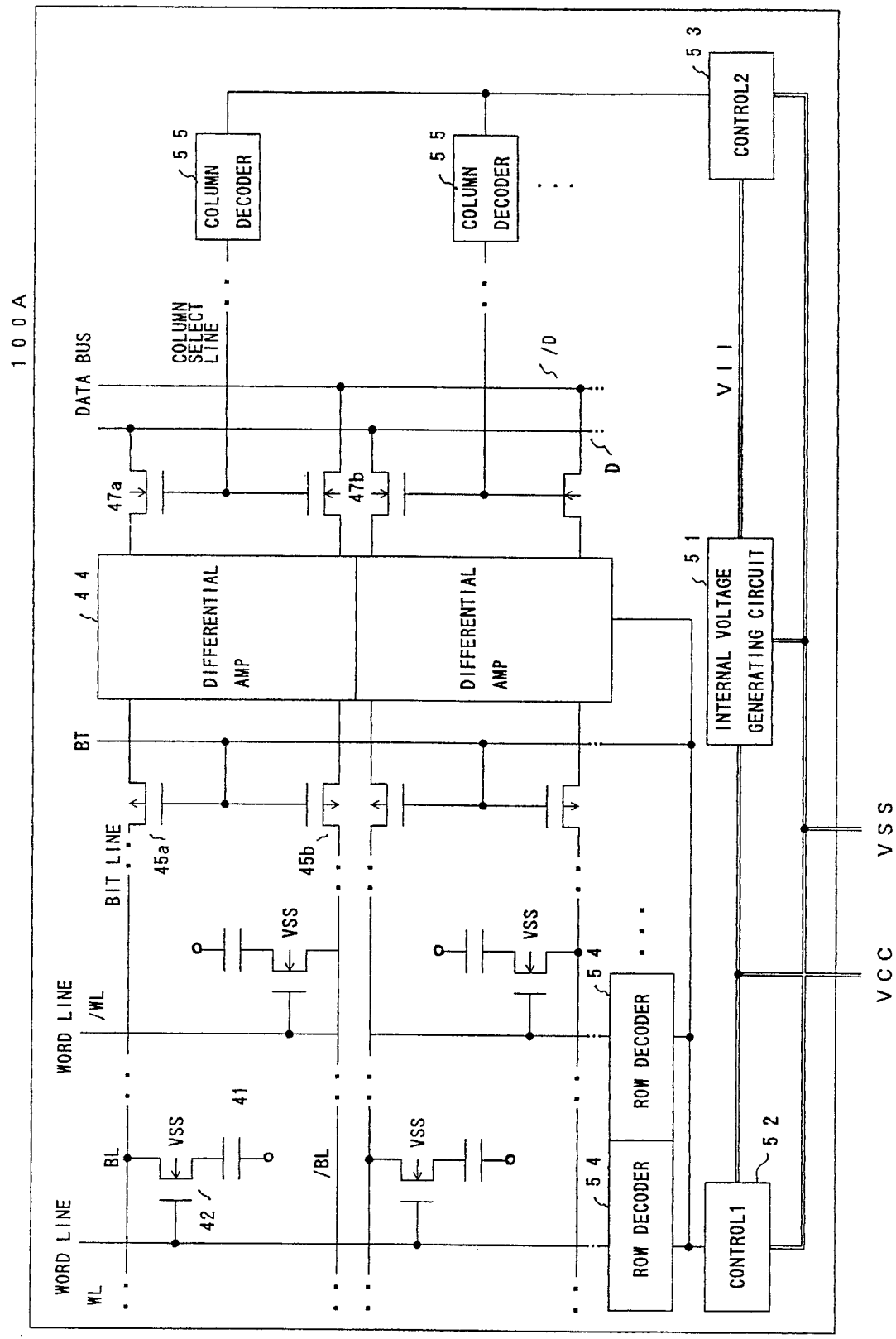
FIG. 9 is a block diagram of a DRAM device equipped with the circuit shown in FIG. 5.

FIG. 9 is a block diagram of essential parts of a DRAM device using the circuit configuration shown in FIG. 5. In FIG. 9, parts that are the same as those shown in FIG. 5 are given the same reference numbers as previously. A DRAM device 100A shown in FIG. 9 has memory cells, each of which comprises the cell capacitor 41 and the cell transistor 42. These memory cells are connected to a pair of bit lines BL and /BL in alternating fashion (folded type). The cell transistor 42 is a depletion-type N-channel MOS transistor and is supplied with a back-gate voltage equal to the ground voltage VSS. The gates of the cell transistors 42 shown in the figure are connected to a pair of word lines WL and /WL. A row decoder 54 which selectively drives the word lines is connected to each of the pairs of word lines WL and /WL.

Pairs of bit lines BL and /BL are connected to the differential amplifiers 44 via the BT gates 45a and 45b, respectively. The gates of the BT gates 45a and 45b are supplied with the selection signal BT. The differential amplifiers 44 are connected to a pair of data bus lines D and /D via column selection gates, each of which gates is made up of N-channel MOS transistors 47a and 47b. Column decoders 55 are connected to the gates of the column selection gates 47a and 47b.

The external power supply voltage VCC on the high potential side is applied to an internal power supply voltage generating circuit 51 and a first control circuit 52. The external power supply voltage VSS on the low potential side is applied to the internal power supply voltage generating circuit 51, the first control circuit 52, and a second control circuit 53. The internal voltage generating circuit 51 generates an internal power supply voltage VII by lowering the external power supply voltage VCC, and outputs it to the second control circuit 53. The second control circuit 53 includes a group of circuits in the DRAM device operating on a voltage between the external power supply voltage VCC and the internal power supply voltage VII. Each of the column decoders 55 operates in the voltage range between VCC and VII under the control of the second control circuit 53. The first control circuit 52 includes a group of circuits in the DRAM device operating on a voltage between the external power supply voltages VCC and VSS. The BT gates 45a and 45b, the row decoder 54, and the differential amplifier 44 operates in the voltage range between VCC and VSS under the control of the first control circuit.

Figure 10:
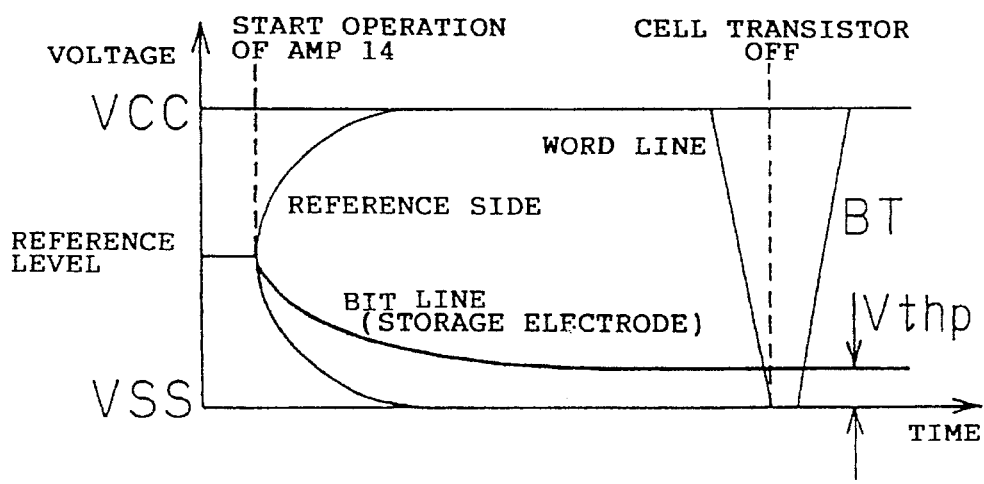
FIG. 10 is a waveform diagram of an operation of the circuit shown in FIG. 9 performed when data "0" is written into a selected memory cell.
Figure 11:
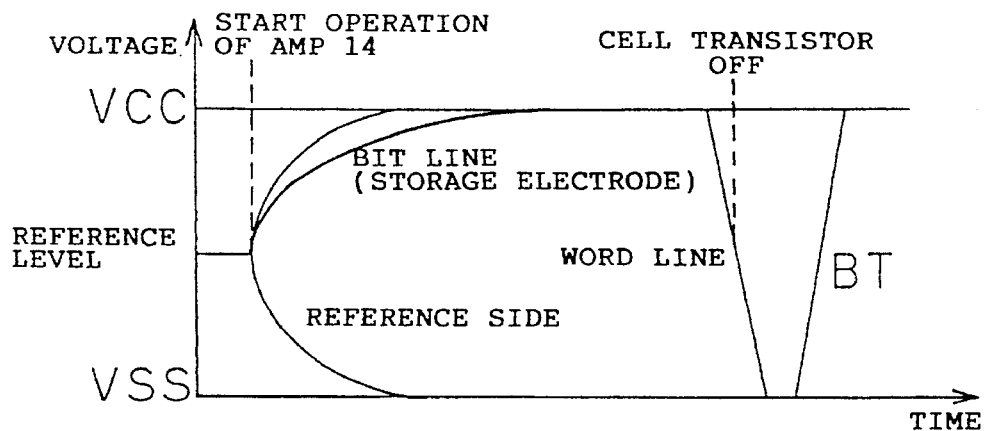
FIG. 11 is a waveform diagram of an operation of the circuit shown in FIG. 9 performed when data "1" is written into a selected memory cell.

FIGS. 10 and 11 show the operation waveforms observed when data "0" and data "1" respectively, are written to the DRAM device 100A shown in FIG. 9.

In FIG. 10, the first control circuit 52 starts the operation of the differential amplifier 44 in a state in which the pair of bit lines BL and /BL is pre-charged to the reference value (e.g., VCC/2). When data "0" is written into a memory cell connected to the bit line BL, the voltages of the data buses D and /D are driven to specified levels, for example, to VCC and VSS, respectively. The potentials of the data buses D and /D are given to the differential amplifier 44 via the column selection gates 47a and 47b. The differential amplifier 44 drives the potentials of the bit lines BT and /BT toward the VSS and VCC levels, respectively. The BT gate 45b supplies the power supply voltage VCC to the bit line /BL and sets the bit line /BL to the VCC level. The BT gate 45a sets the bit line BL to the potential VSS+Vthp (Vthp denotes the threshold voltage of the BT gate 45a). As a result, data "0" is written into the selected memory cell. Thereafter, the level of the corresponding word line W is set to VSS, and the selection signal BT is switched to the VCC level.

In FIG. 11, the first control circuit 52 starts the operation of the differential amplifier 44 in a state in which the pair of bit lines BL and /BL is pre-charged to the reference value (e.g., VCC/2). When data "1" is written into a memory cell connected to the bit line BL, the potentials of the data buses D and /D are driven to specified levels, for example, to VSS and VCC, respectively. The potentials of the data buses D and /D are given to the differential amplifier 44 via the column selection gates 47a and 47b, respectively. The differential amplifier 44 drives the potentials of the bit lines BT and /BT toward the VCC and VSS levels, respectively. The BT gate 45b sets the bit line BL to the potential of VSS+Vthp (Vthp denotes the threshold voltage of the BT gate 45b). The BT gate 45a supplies the power supply voltage VCC to the bit line BL, setting the bit line BL to the VCC level. As a result, data "1" is written into the selected memory cell. Thereafter, the level of the corresponding word line W is set to VSS, and the selection signal BT is switched to the VCC level.

As shown in FIGS. 10 and 11, the potential difference between data "0" and "1" is VCC–Vthp, and the substrate of the cell transistor 42 is set to VSS. Hence, the reverse voltage Vthp is applied to the memory cell. Therefore, a voltage generator for generating the voltage VBB used in the prior art is not needed here.

Although a voltage generator for generating a lowered voltage of VSS–Vthp is needed in order to set the potential difference between data "0" and "1" to VCC, it does not need to be placed separately from the VBB voltage generator in the prior art.

Figure 12:
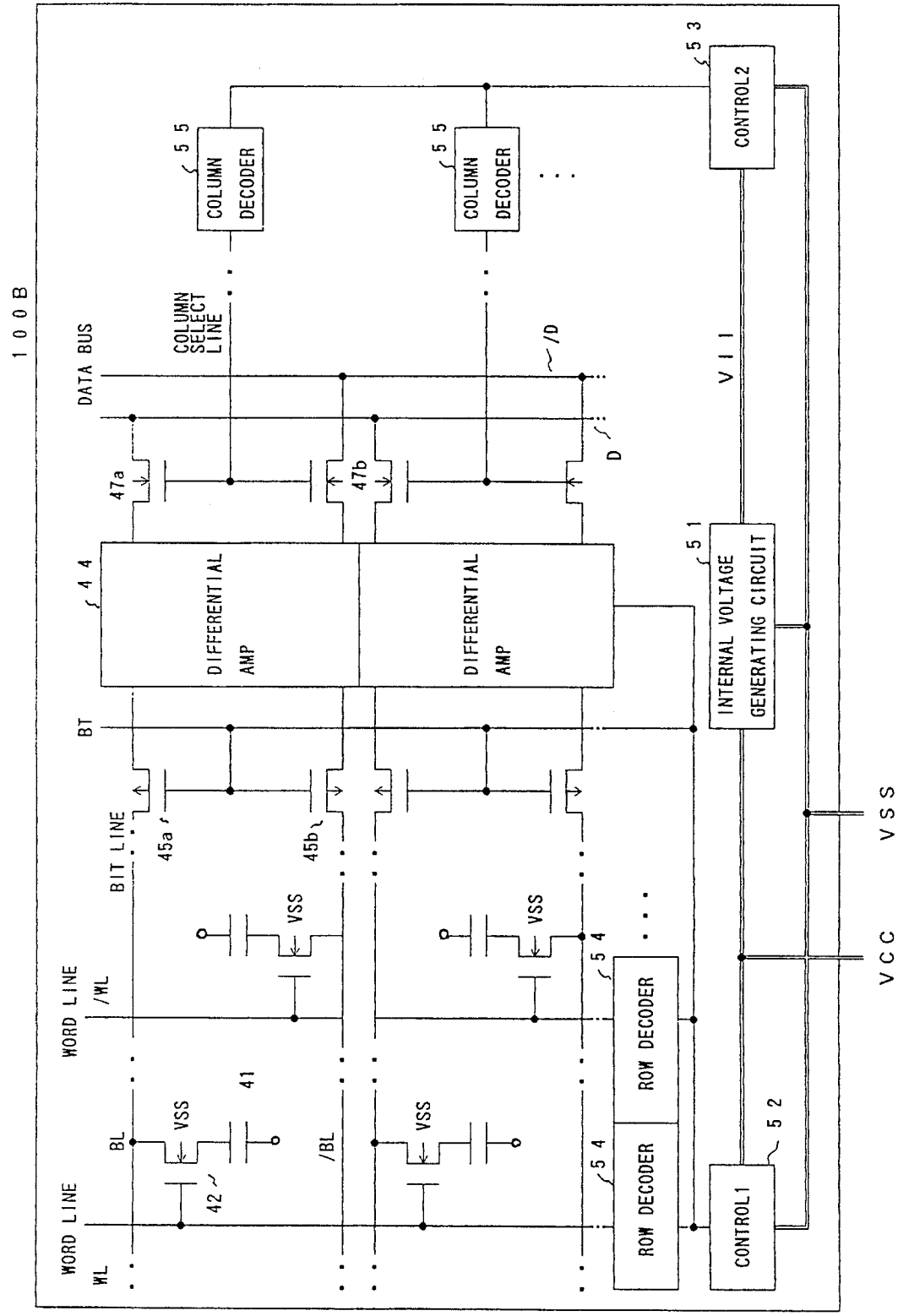
FIG. 12 is a circuit diagram of another DRAM device having the circuit shown in FIG. 5.

FIG. 12 is a block diagram of essential parts of another structure of the DRAM device employing the circuit configuration shown in FIG. 5. In FIG. 12, parts that are the same as those shown in FIG. 5 are given the same reference numbers. The DRAM device 100B, shown in FIG. 12, differs from that shown in FIG. 9 in the following respects. The operating voltage for the differential amplifier 44 shown in FIG. 12 is supplied by the second control circuit 53. In other words, the differential amplifier 44 shown in FIG. 12 operates within the voltage range between the external power supply voltage VCC and the internal power supply voltage VII. In the configuration shown in FIG. 10, the BT gates 45a and 45b are formed with P-channel MOS transistors so that the potentials of the bit lines BL and /BL do not fall to VSS when data "0" is written. In FIG. 12, the amplitude range of the differential amplifier 44 is set to VCC+VII to ensure that the potentials of the bit lines BL and /BL do not fall to VSS when data "0" is written. This does not create the need for a negative back-gate voltage, which is needed for the prior-art semiconductor memory device.

Figure 13:
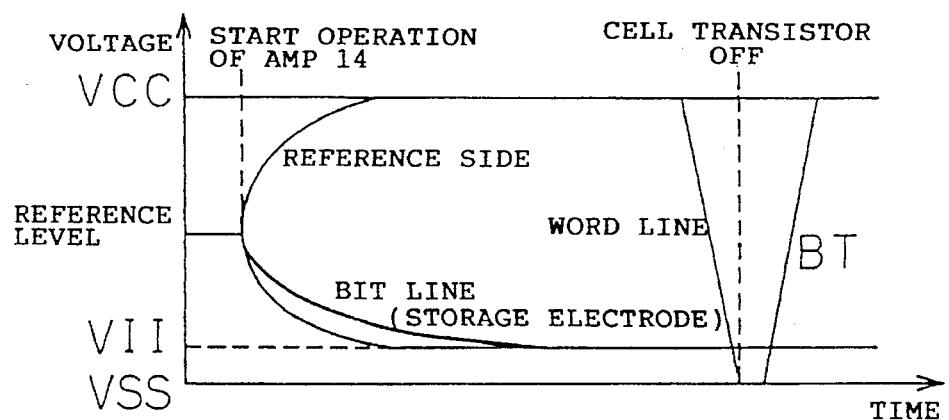
FIG. 13 is a waveform diagram of an operation of the circuit shown in FIG. 12 performed when data "0" is written into a selected memory cell.

FIG. 13 shows the operation waveforms observed when data "0" is written into a memory cell of the DRAM device 100B. In FIG. 13, the first control circuit 52 starts the operation of the differential amplifier 44 in a state in which the pair of bit lines BL and /BL is pre-charged to the reference value (e.g., VCC/2). When data "0" is written into a memory cell connected to the bit line BL, the potentials of the data buses D and /D are driven to specified levels, for example, to VCC and VSS, respectively. The potentials of the data buses D and /D are given to the differential amplifier 44 via the column selection gates 47a and 47b. The differential amplifier 44 drives the potentials of the bit lines BT and /BT toward the VSS and VCC levels, respectively. The BT gate 45b supplies the power supply voltage VCC to the bit line /BL, setting the bit line /BL to the VCC level. The BT gate 45a sets the potential of the bit line BL to VII. As a result, data "0" is written into the selected memory cell. Thereafter, the level of the corresponding word line W is set to VSS, and the selection signal BT is switched to the VCC level.

Figure 14:
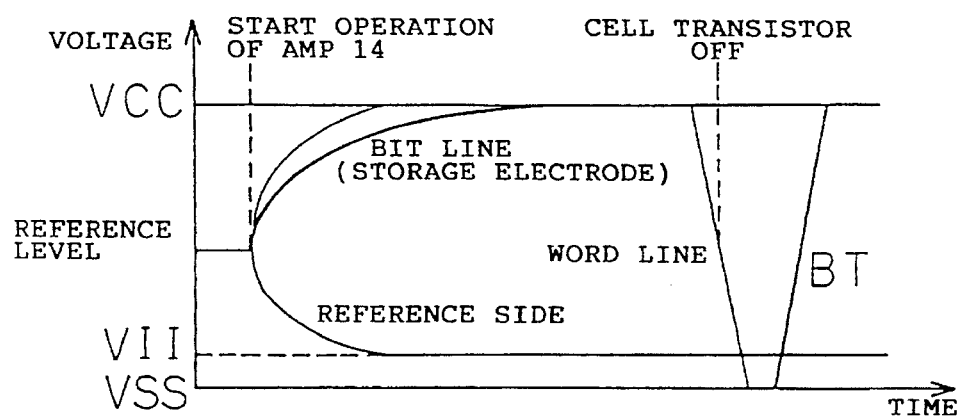
FIG. 14 is a waveform diagram of an operation of the circuit shown in FIG. 12 performed when data "1" is written into a selected memory cell.

FIG. 14 shows the operation waveforms observed when data "1" is written into a selected memory cell. The first control circuit 52 starts the operation of the differential amplifier 44 in a state in which the pair of bit lines BL and /BL is precharged to the reference value (e.g., VCC/2). When data "1" is written into a memory cell connected to the bit line BL, the potentials of the data buses D and /D are driven to specified levels, for example, to VSS and VCC, respectively. The potentials of the data buses D and /D are given to the differential amplifier 44 via the column selection gates 47a and 47b, respectively. The differential amplifier 44 drives the potentials of the bit lines BT and /BT toward the VCC and VSS levels, respectively. The BT gate 45b sets the potential of the bit line BL to VII. The BT gate 45a supplies the power supply voltage VCC to the bit line BL, setting the potential on the bit line BL to the VCC level. As a result, data "1" is written into the selected memory cell. Thereafter, the level of the corresponding word line W is set to VSS, and the selection signal BT is switched to the VCC level.

It should be noted that, as shown in FIGS. 13 and 14, the potential difference between data "0" and "1" is VCC–VII, and the substrate of the cell transistor 42 is set to VSS. Hence, a reverse voltage of Vthp is applied to the memory cell. Therefore, a VBB voltage generator used in the prior art device is no longer needed.

It should also be noted that although there is a need for a voltage generator for generating a lowered voltage VSS–VII in order to set the potential difference between data "0" and "1" to VCC, it does not need to be placed separately from the VBB voltage generator as in the prior art device.

FIG. 15 compares the operation of the configuration shown in FIG. 12 with the operation of the prior art configuration shown in FIG. 1. The external power supply voltage VCC is 3.3 V, and the internal power supply voltage VII is 2.3 V. The differential amplifier 44 shown in FIG. 12 operates on the internal power supply voltage VII when read and write operations are performed, and is set, in the standby state, to a predetermined pre-charge voltage (1.15 V both on the high and the low sides). The differential amplifier in the prior art circuit configuration operates in the same manner as above. In the conventional configuration, the cell transistor 12 is formed with an enhancement-type N-channel MOS transistor having a threshold voltage (referred to as VthCell in FIG. 15) of 1.0 V. In the configuration shown in FIG. 12, the cell transistor 42 is formed with a depletion-type MOS transistor having a threshold voltage VthCell of 0.0 V. The threshold voltages Vthp of the P-channel MOS transistors constituting the BT gates 45a and 45b are −1.0 V.

In FIG. 15, while the back-gate voltage VBB is −1.0 V in the prior art configuration, it is 0.0 V (=VSS) in the configuration of the first embodiment (referred to as "present invention" in FIG. 15). In a standby state, when the memory cell retains data "0", the potential difference Vbs between the substrate and the source is −1.0 V. The potential difference Vbs is −1.0 V in the configuration of the first embodiment of the present invention. When the memory cell retains data "1", the potential difference Vbs is −2.15 in both cases. That is, the configuration of the first embodiment of the present invention can obtain the same back-gate voltage as in the prior art configuration without a separate voltage generator for generating the voltage VBB.

Also, the difference between the threshold voltage VthCell and the gate-source voltage Vgs in the configuration of the first embodiment of the present invention is equal to that of the prior art configuration. More specifically, the above potential difference is equal to 1.0 V in the standby state in which the memory cell retains data "0" and is equal to 2.15 V in the standby state in which the memory cell retains data "1". Thus, it is understood that the configuration of the first embodiment of the present invention is essentially in the same standby state as is the prior art configuration.

When data "0" is written, the source of the cell transistor is at 0 V in the prior art configuration, while it is at 1.0 V in the configuration of the first embodiment of the present invention. When data "1" is written, the source of the cell transistor is at 2.4 V (VCC−VthCell), while it is 3.3 V (=VCC) in the configuration of the first embodiment of the present invention. In the configuration of the first embodiment of the present invention, the potential of the word line is 1.0 V and 3.3 V when data "0" and "1" are written, respectively. In comparison, the potential of the word line is 1.0 V and 3.4 V in the prior art configuration when data "0" and "1" are written, respectively. Thus, the prior art configuration needs a voltage generator which boosts up the potential of the word line to 3.3 V or higher, this voltage being the write voltage on the high potential side.

A read operation is essentially the same in both in the prior art configuration and the configuration of the first embodiment of the present invention, although the potentials of the components are different.

Figure 16:
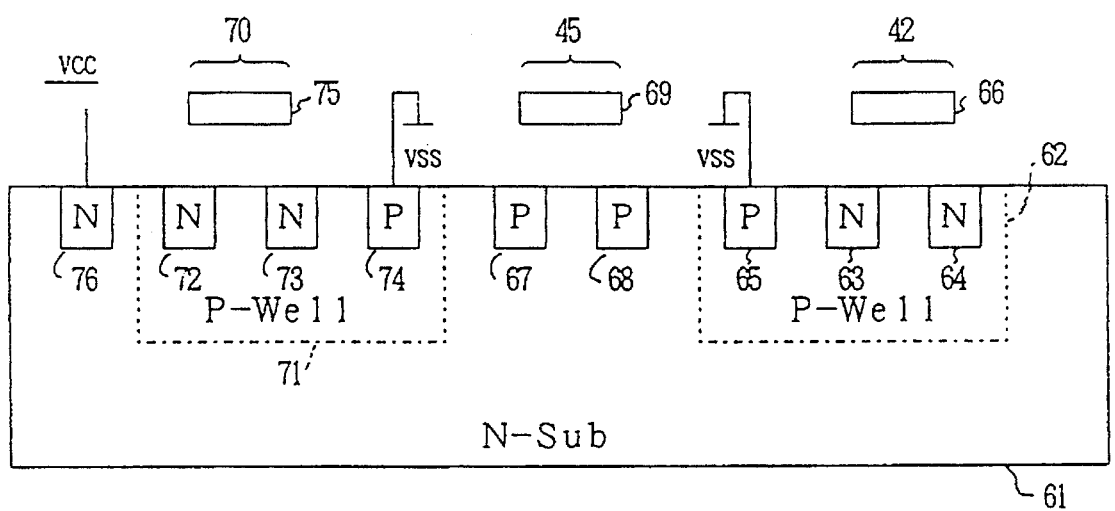
FIG. 16 is a cross-sectional view of a transistor used in the embodiments of the present invention.

FIG. 16 is a cross-sectional view of the structure of the MOS transistors shown in FIG. 5. In the structure shown in FIG. 16, MOS transistors are formed in an N-type substrate 61. A P-type well 62 is formed in the N-type substrate 61 to form the cell transistor 42, and two N-type diffusion layers 63 and 64 are formed in the P-type well 62. The two N-type diffusion layers form the source and drain of the cell transistor 42, and the P-type diffusion layer 65 is set to the power supply voltage VSS. It should be noted that the gate electrode 66 is formed on an insulation layer which is not shown in the figure.

Also, two P-type diffusion layers 67 and 68 are formed in the N-type substrate 61 to form P-type MOS transistors, such as the BT gate 45. These P-type diffusion layers 67 and 68 constitute the source and drain of the BT gate 45, respectively. A gate electrode 69 of the BT gate 45 is formed on an insulation layer which is not shown in the figure.

Further, a P-type well 71 is formed in the N-type substrate 61 to form an N-type MOS transistor, and two N-type diffusion layers 72 and 73 are formed in the P-type well 71.

The N-type diffusion layers 72 and 73 constitute the source and drain, respectively, of the transistor. A P-type diffusion layer 76 is set to the power supply voltage VSS in order to bias the N-type substrate 61. The gate electrode 75 is formed on an insulation layer which is not shown in the figure.

It should be noted that a substrate bias voltage equal to VCC is applied to the N-type diffusion layer 76 formed in the N-type substrate 61.

Figure 17:
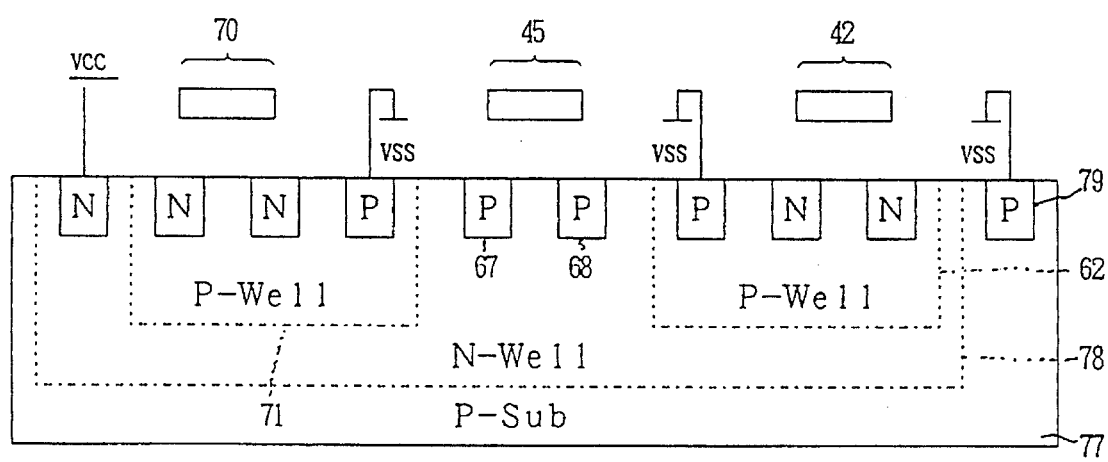
FIG. 17 is a cross-sectional view of another structure of the transistor used in the embodiments of the present invention.

FIG. 17 shows a transistor structure using a P-type substrate 77. An N-type well 78 is formed in the P-type substrate 77, and P-type wells 62 and 63 and P-type diffusion layers 67 and 68 are formed in the N-type well 78. The diffusion layer 79 formed in the P-type substrate 77 is set to the power supply voltage VSS to bias the P-type substrate 77.

Figure 18:
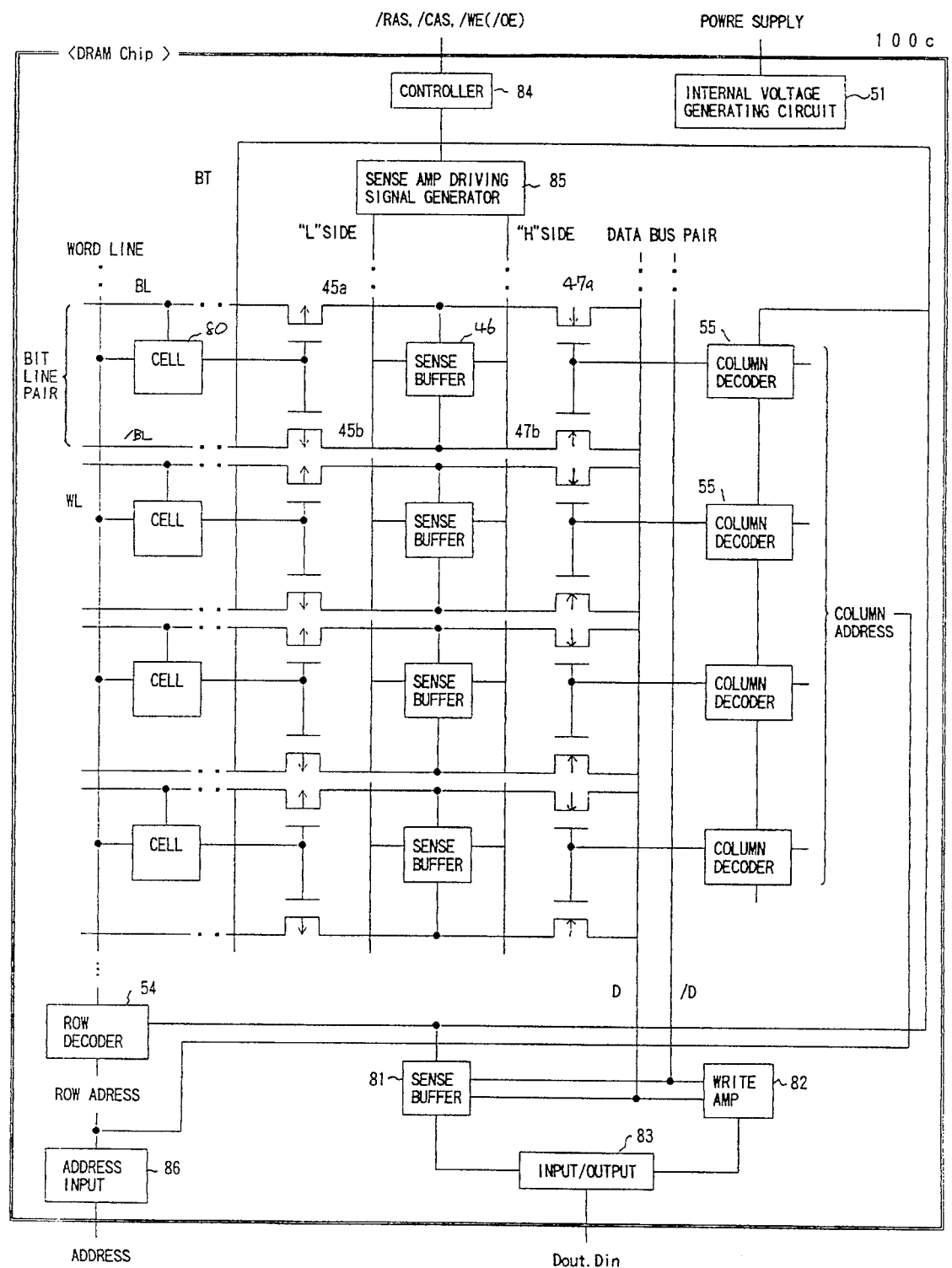
FIG. 18 is a block diagram of a DRAM device equipped with the structure shown in FIG. 9 or FIG. 12.

FIG. 18 shows the structure of the overall DRAM device having the configuration shown in FIG. 12 or 14. FIG. 18, parts that are the same as those shown in the previously described figures are given the same reference numbers. A DRAM device 100C shown in FIG. 18 has memory cells arranged in matrix form. Each memory cell 80 contains a cell capacitor 41 and a cell transistor 42, and is connected to one word line (only word line WL is shown in FIG. 18) and one bit line (either BL or /BL). Each memory cell 80 is connected via a BT gate to the differential amplifier 44, which functions as a sense amplifier. The differential amplifier 44 is connected to a pair of data buses D and D via a column selection gate 47.

A sense buffer 81 and a write amplifier 82 are connected to one pair of data buses. An I/O circuit 83 connected to the sense buffer 81 and the write amplifier 82 outputs input data (write data) Din to the write amplifier 82 and outputs output data (read data) Dout from the sense buffer 81 to outside.

A controller 84 receives a row address strobe signal /RAS, a column address strobe signal /CAS and a write enable signal /WE, and generates various timing signals (control signals) necessary for the DRAM operation. It should be noted that when there are selectable bits, an output enable signal /OE is also supplied to the controller 84. A sense amplifier drive signal generating circuit 85 receives predetermined control signals from the controller 84, and generates sense amplifier driving signals on the low-level and high-level sides. The low-level and high-level sense amplifier driving signals are both supplied to a sense amplifier 46.

An address input circuit 86 receives address signals from outside, outputs a row address to the row decoder 54, and outputs a column address to the column decoder 55. It should be noted that FIG. 18 shows only the row decoder 54 corresponding to a single word line WL for the sake of simplicity. Each column decoder 55 decodes the column address, generates selection signals, and outputs the selection signals to the corresponding column selection gates 47a and 47b. The row decoder 54 decodes the row address from the address input circuit 86 and selects one of the word lines WL connected to the memory cell.

The internal voltage generating circuit 51 generates the internal power supply voltage VII from the external power supply voltage VCC. The first control circuit 52 in FIG. 9 includes the sense buffer 81, the write amplifier 82, the I/O circuit 83, the controller 84, the sense amplifier driving signal generating circuit 85, and the address circuit 86. The second control circuit 53 in FIG. 9 includes the address input circuit 86 shown in FIG. 18. Here, however, the second control circuit 53 has the functions of the address input circuit 86, and the address input circuit 86 itself does not operate on the internal power supply voltage VII.

The first control circuit 52, shown in FIG. 12, includes the sense buffer 81, the write amplifier 82, the I/O circuit 83, the controller 84, and the address input circuit 86. The second control circuit includes the controller 84, the sense amplifier driving signal generating circuit 85, and the address input circuit 86.

Figure 19:
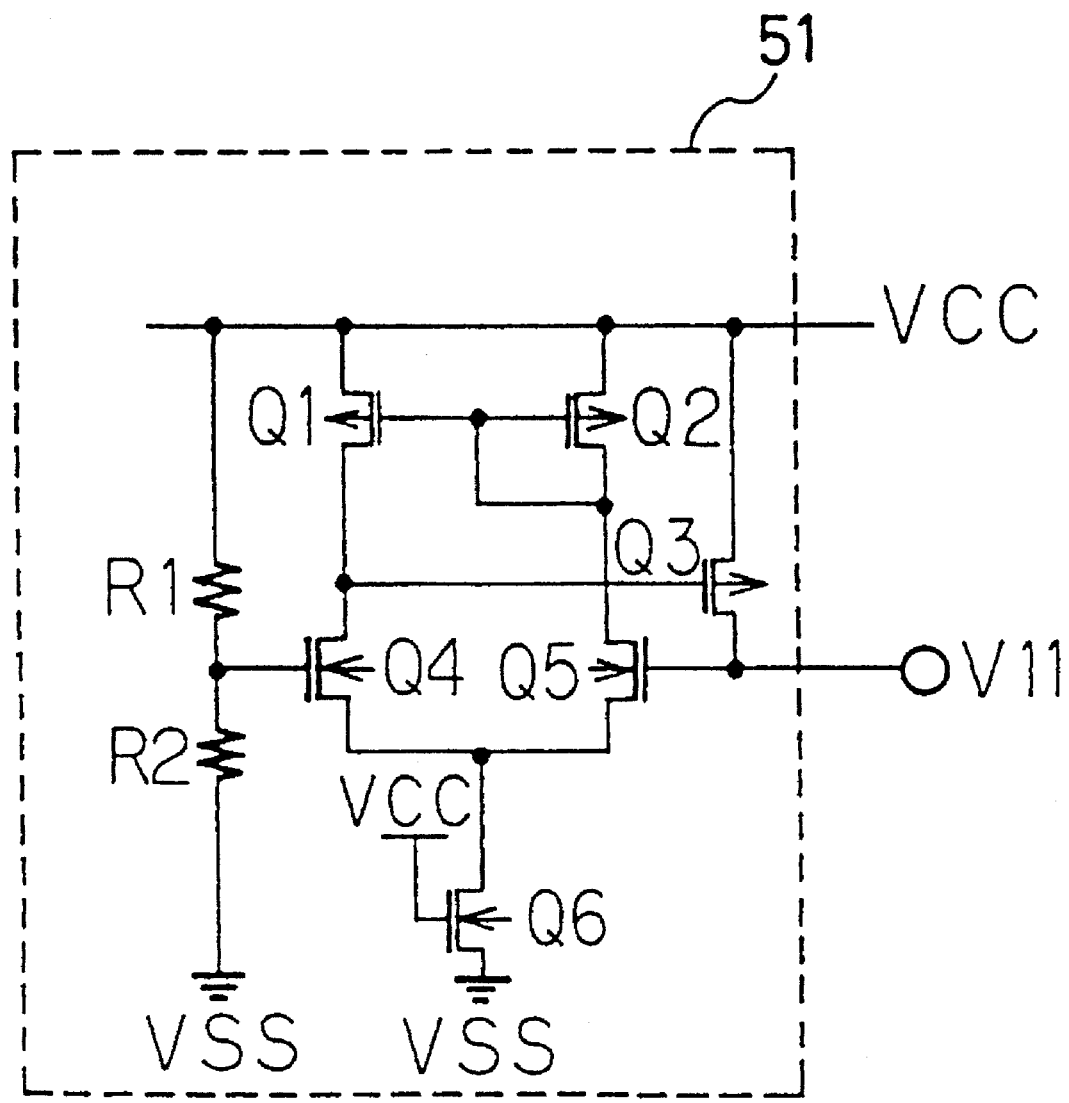
FIG. 19 is a circuit diagram of an internal voltage generating circuit shown in FIG. 18.

FIG. 19 is a circuit diagram of an example of the configuration of the internal voltage generating circuit 51. As shown in the figure, the internal voltage generating circuit 51 has P-channel MOS transistors Q1, Q2, and Q3, N-channel MOS transistors Q4, Q5, and Q6, and two resistors R1 and R2. The voltage divided by the resistors R1 and R2 is applied to the gate of transistor Q4. The constant internal power supply voltage VII is output from the gate of transistor Q5.

When the internal power supply voltage VII drops, the currents passing through transistors Q2 and Q3 are decreased, and the drain current of transistor Q2 is increased. Since the drain of transistor Q2 is connected to the gates of transistors Q1 and Q2 (constituting a current mirror circuit), an increase in the potential of the drain of transistor Q2 causes a decrease in the current flowing in transistor Q1. This in turn results in a drop in the potential of the drain of transistor Q4. This drop in the potential of the drain of transistor Q4 results directly in a drop in the potential of the gate of transistor Q3, causing an increase in the potential of the drain of transistor Q3. This compensates for the drop in the internal power supply voltage VII.

Figure 20:
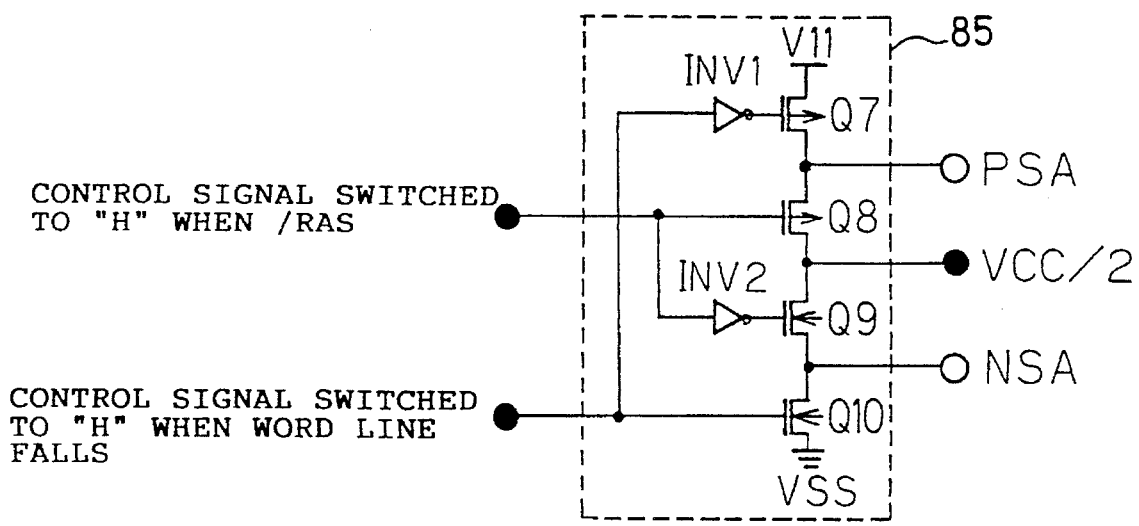
FIG. 20 is a circuit diagram of a sense amplifier driving signal generating circuit shown in FIG. 18.

FIG. 20 is a circuit diagram of an example of the configuration of the internal voltage generating circuit 85, which operates within the voltage range between VCC and VII. The internal voltage generating circuit 85 comprises two inverters INV1 and INV2, two P-channel MOS transistors Q7 and Q8, and two N-channel MOS transistors Q9 and Q10. The control signal generated at the controller 84 which switches to high level at the fall of the row address strobe signal /RAS is fed to the gate of transistor Q8 and the inverter INV2. A control signal (latch enable signal) which switches to high level at the rise of the word line is given to the gate of transistor Q10 and the inverter INV1. A voltage of VCC/2 is applied to the gates of transistors Q8 and Q9. VCC/2 can be obtained by means of voltage division by connecting two resistors with the same resistance serially between VCC and VSS.

Before read and write operations, since the row address strobe signal /RAS is at the higher level, a low-level control signal is given to transistor QS, and a high-level signal is applied to transistor Q9 via the inverter INV2. Therefore, the voltage VCC/2 (referred to as signal PSA) is applied to the P-channel MOS transistor of the sense amplifier 46 via the transistor QS, and the voltage VCC/2 (referred to as signal NSA) is applied to the N-channel MOS transistor of the sense amplifier 46 via the transistor Q9. When the read or write operation is performed, the transistors Q8 and Q9 are turned off and the transistors Q7 and Q10 are turned on. Thus, the internal power supply voltage VII and the power supply voltage VSS are applied to sense amplifier 46.

It should be noted that when the sense amplifier driving signal generating circuit 85 has the configuration shown in FIG. 9, the external power supply voltage VCC is applied to the source of the transistor Q7 instead of the internal power supply voltage VII.

Figure 21:
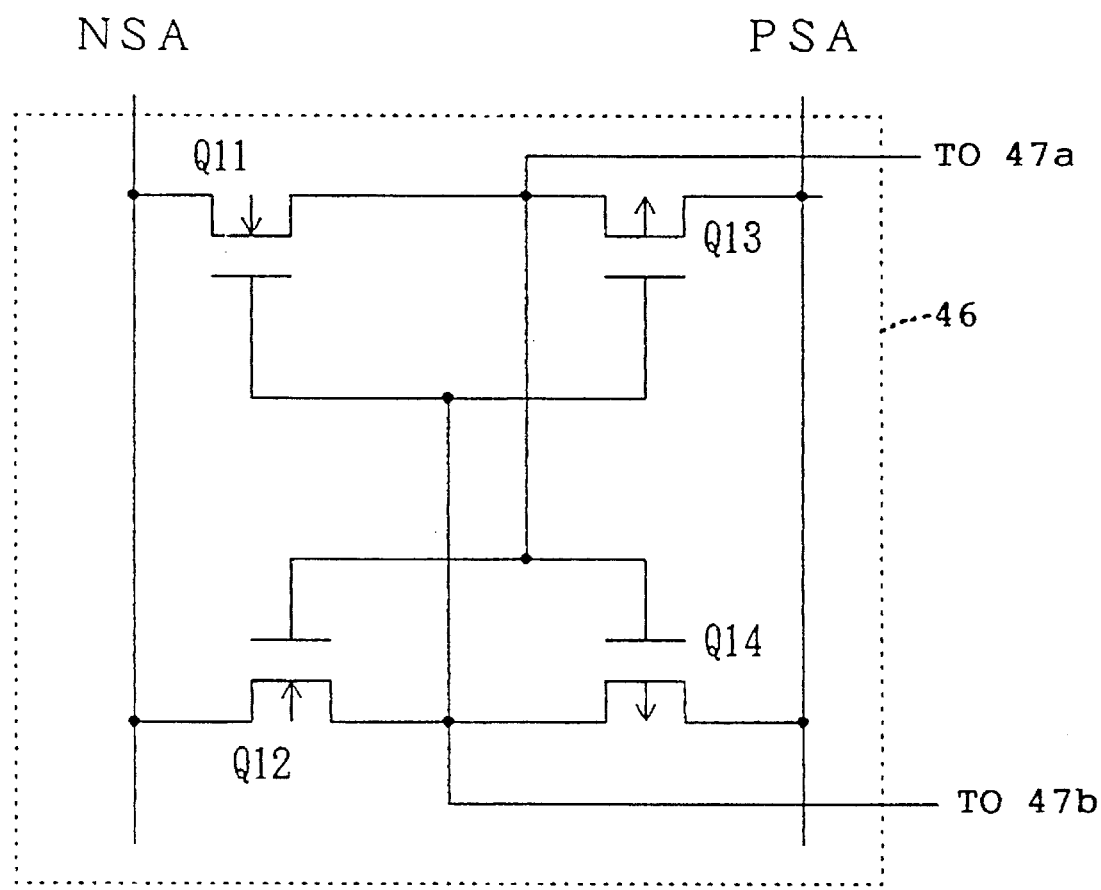
FIG. 21 is a circuit diagram of a sense amplifier shown in FIG. 18.

FIG. 21 is a circuit diagram of an example of the configuration of the sense amplifier 46. The sense amplifier 46 has two N-channel MOS transistors Q11 and Q12 and two P-channel MOS transistors Q13 and Q14. As shown in FIG. 20, the signal NSA is applied to transistors Q11 and Q12, and the signal PSA is applied to transistors Q13 and Q14. As explained above, the power supply voltage VCC or VII is NSA or PSA. The connecting node between transistors Q11 and Q13 is connected to the column selection gate 47a (FIG. 18), and the contact point between transistors Q12 and Q14 is connected to the column selection gate 47b.

Figure 22:
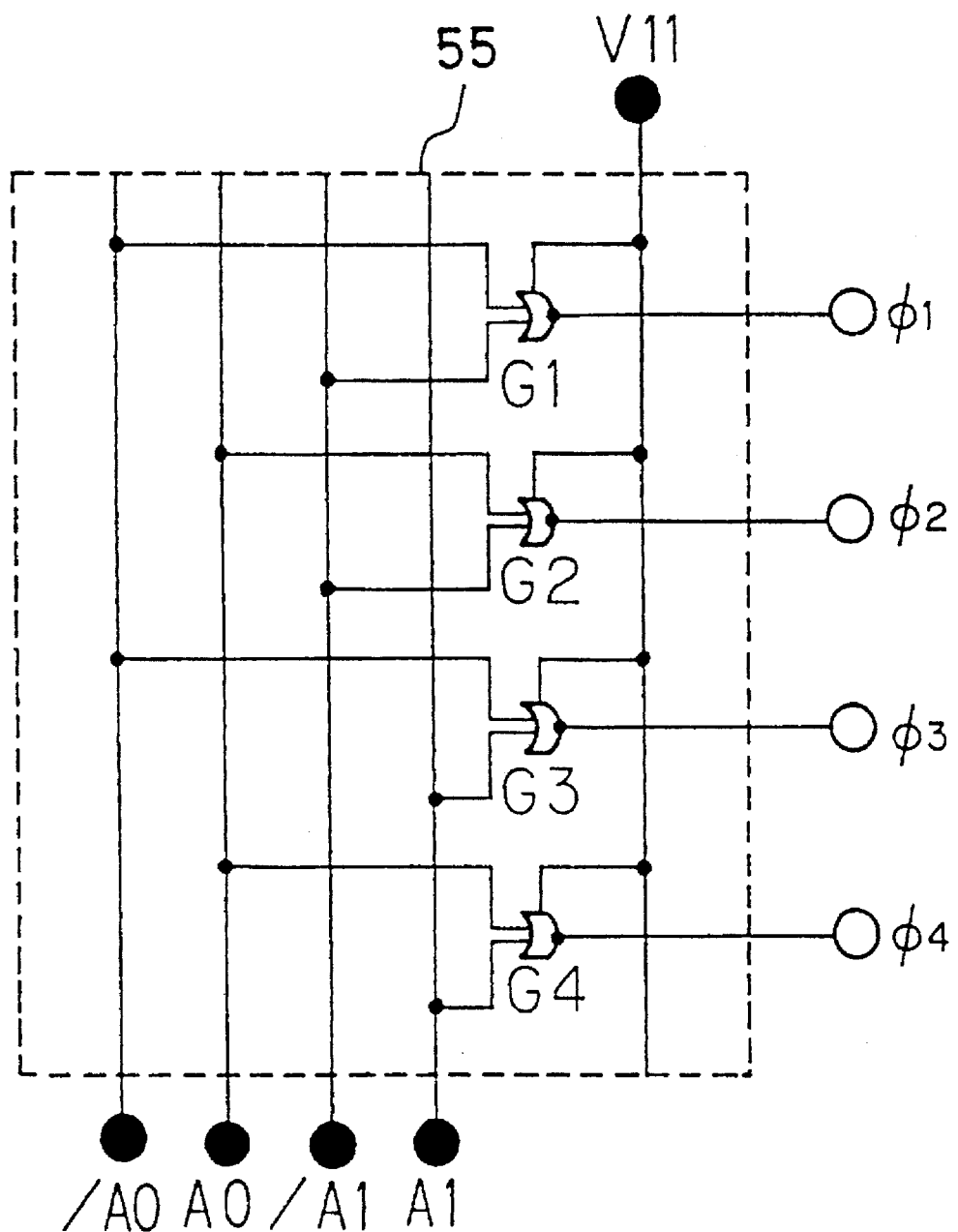
FIG. 22 is a circuit diagram of a column decoder shown in FIG. 18.

FIG. 22 is a circuit diagram showing the structure of the decoder circuit 55 shown in FIG. 18 (which is equal to four bits, i.e., corresponds to the four decoder circuits shown in FIG. 18). The decoder circuit 55 comprises four NOR gates G1-G4, which operate on the internal power supply voltage VII. Each of the NOR gates G1-G4 receives two bits from among address bits A0, /A0, A1, and /A1 from the address input circuit 86 and outputs selection signals φ1-φ4, which select column selection gates 47a and 47b.

It should be noted that the row decoder 54 shown in FIG. 18 has a circuit configuration similar to the above, although it operates on the external power supply voltage VCC.

Figure 23:
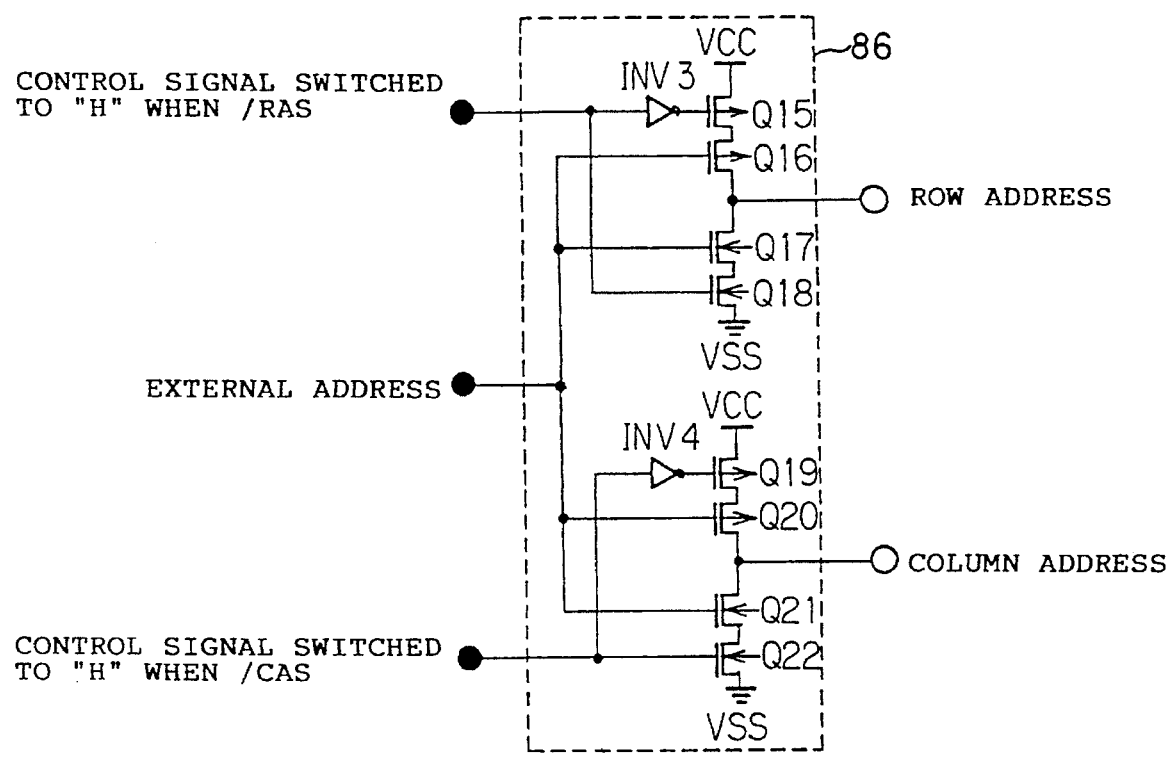
FIG. 23 is a circuit diagram of an address input circuit shown in FIG. 18.

FIG. 23 is a circuit diagram of an example of the configuration of the address input circuit 86. As shown in the figure, the address input circuit 86 is made up of inverters INV3 and INV4, P-channel MOS transistors Q15, Q16, Q19, and Q20, and N-channel MOS transistors Q17, Q18, Q21, and Q22. The control signal generated by the controller 84 and switched to the high level in synchronism with the fall of the row address strobe signal /RAS is applied to the inverter INV3 and the gate of transistor Q18. The control signal generated by the controller 84 and switched to the high level at the rise of the column address strobe signal /CAS is applied to the inverter INV4 and the gate of transistor Q22. The Address signal supplied from outside of the device is applied to the gates of transistors Q16, Q17, Q20 and Q21. When the read or write operation is performed, the row address strobe signal /RAS rises, inputting the external address as the row address, and then the column address strobe signal /CAS falls, inputting the external address as the column address.

Figure 24:
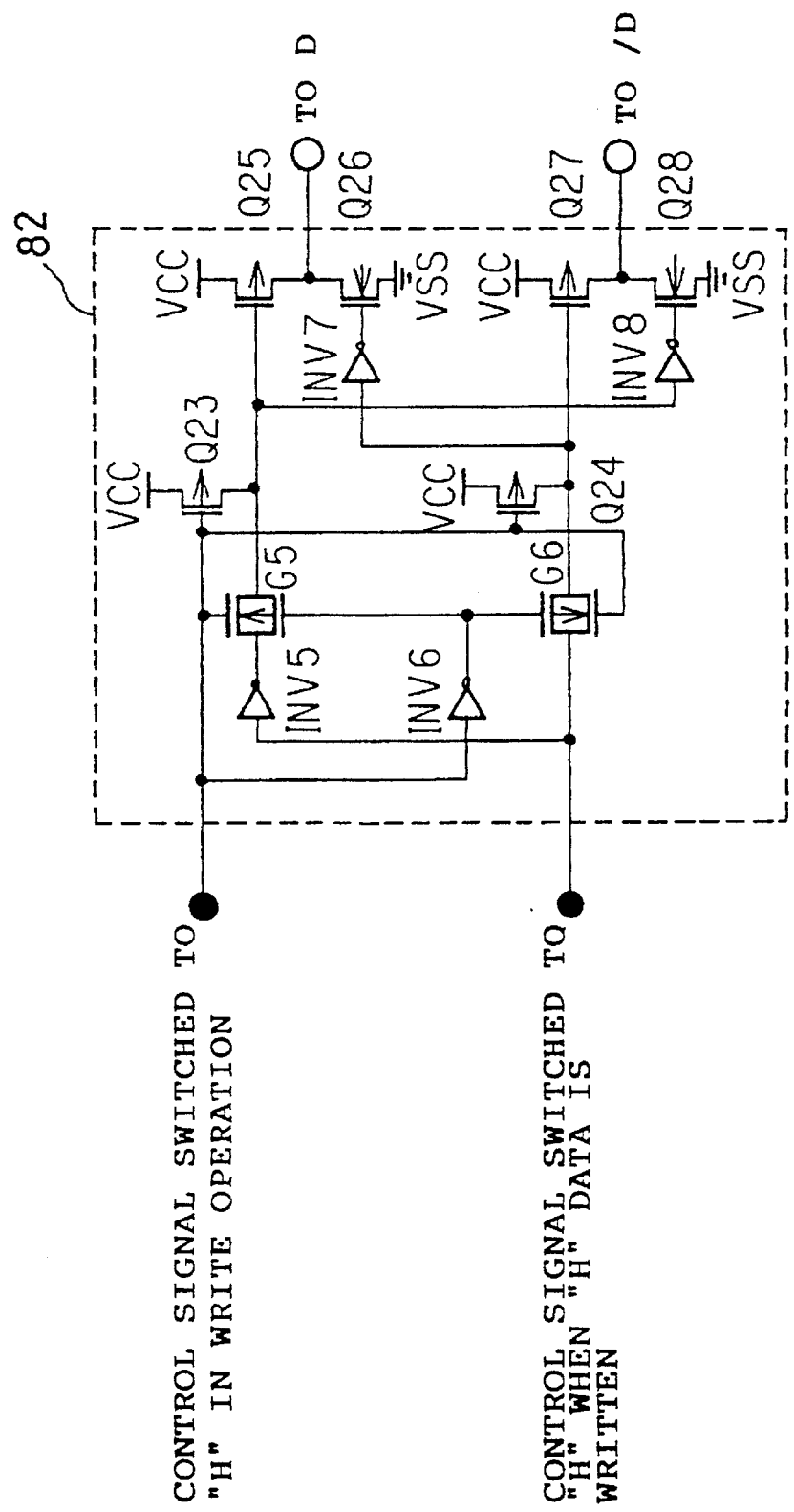
FIG. 24 is a circuit diagram of a write amplifier shown in FIG. 18.

FIG. 24 is a circuit diagram of an example of the configuration of the write amplifier 82 shown in FIG. 18. As shown in the figure, the write amplifier 82 comprises inverters INV5-INV8, P-channel MOS transistors Q23, Q24, Q25, and Q27, and N-channel MOS transistors Q26 and Q28, and gates G5 and G6. As shown in the figure, the write amplifier 82 receives the control signal generated at the controller 84 and switched to the high level at the time of the write operation and a control signal switched to the high level when high-level (H) data is logically written. In operations other than the write operation, the transistors Q25-Q28 are all off. When the write operation is performed, the gates G5 and G6 are opened, and the pair of data buses D and /D is driven according to the value of the control data corresponding to write data.

Figure 25:
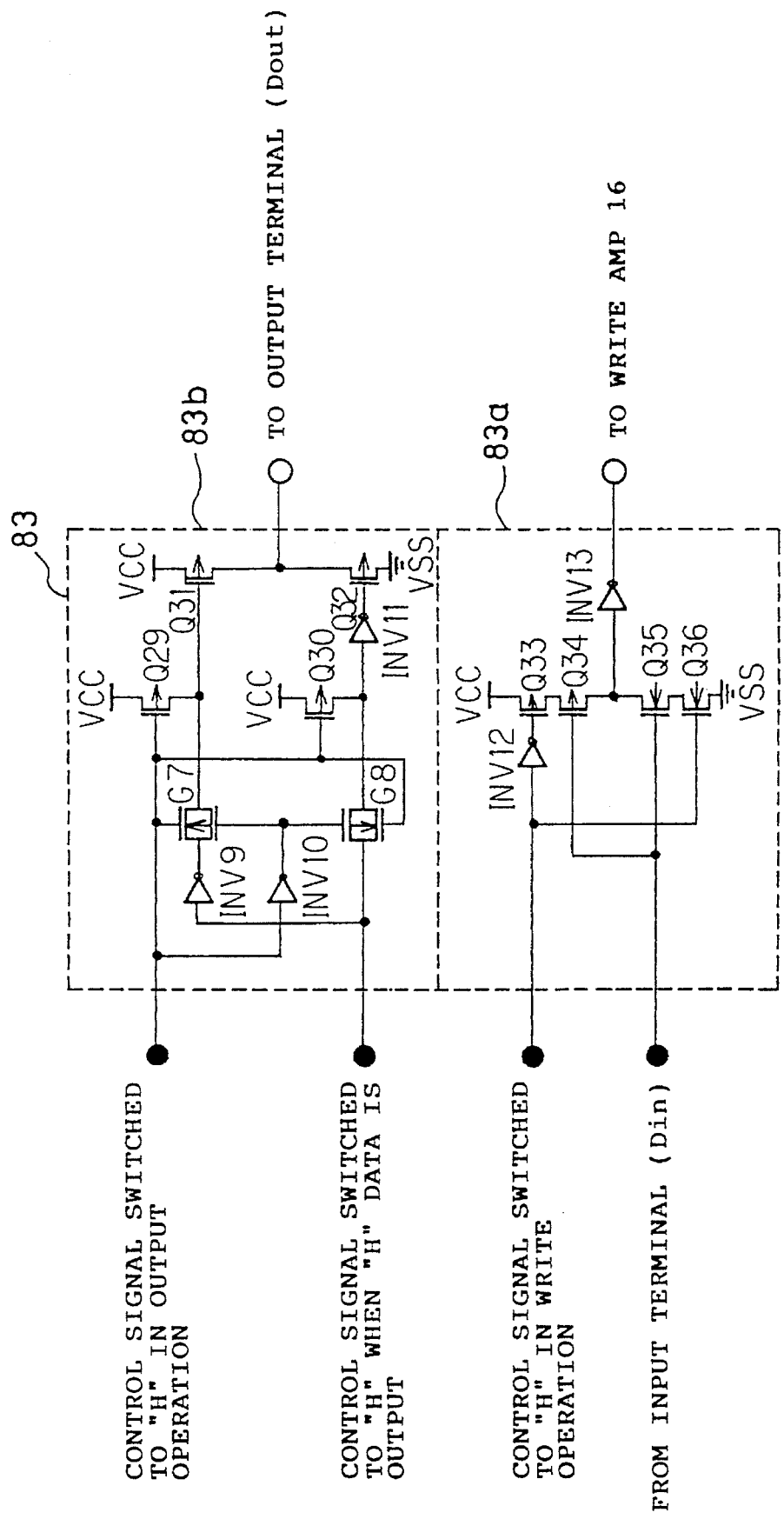
FIG. 25 is a circuit diagram of an input/output circuit shown in FIG. 18.

FIG. 25 is a circuit diagram of an example of the configuration of the I/O circuit 83 shown in FIG. 18. A data output circuit 83b of the I/O circuit 83 comprises inverter INV9-INV11, P-channel MOS transistors Q29-Q31, N-channel transistor Q32, and gates G7 and G8. A data output circuit 83b receives a control signal switched to the high level at the time of the output operation and a control signal switched to the high level when high-level data is output. When the output operation is performed, the transistors Q29 and Q30 are turned off and the gates Q7 and Q8 are opened. When high-level data is output, the transistor Q31 is switched on and transistor Q32 is switched off. A write data input circuit 83a comprises inverters INV12 and INV13, P-channel MOS transistors Q33 and Q34, and N-channel MOS transistors Q35 and Q36. The data input circuit 83a receives data input from outside of the device and a control signal switched to the high level at the time of the write operation. At the time of the write operation, the transistors Q33 and Q34 are turned on. The transistor Q34 is turned on in response to low-level input data, and the transistor Q35 is turned on in response to high-level input data. The drains of transistors Q34 and Q35 are connected to the write amplifier 82 via the inverter INV13.

Figure 26:
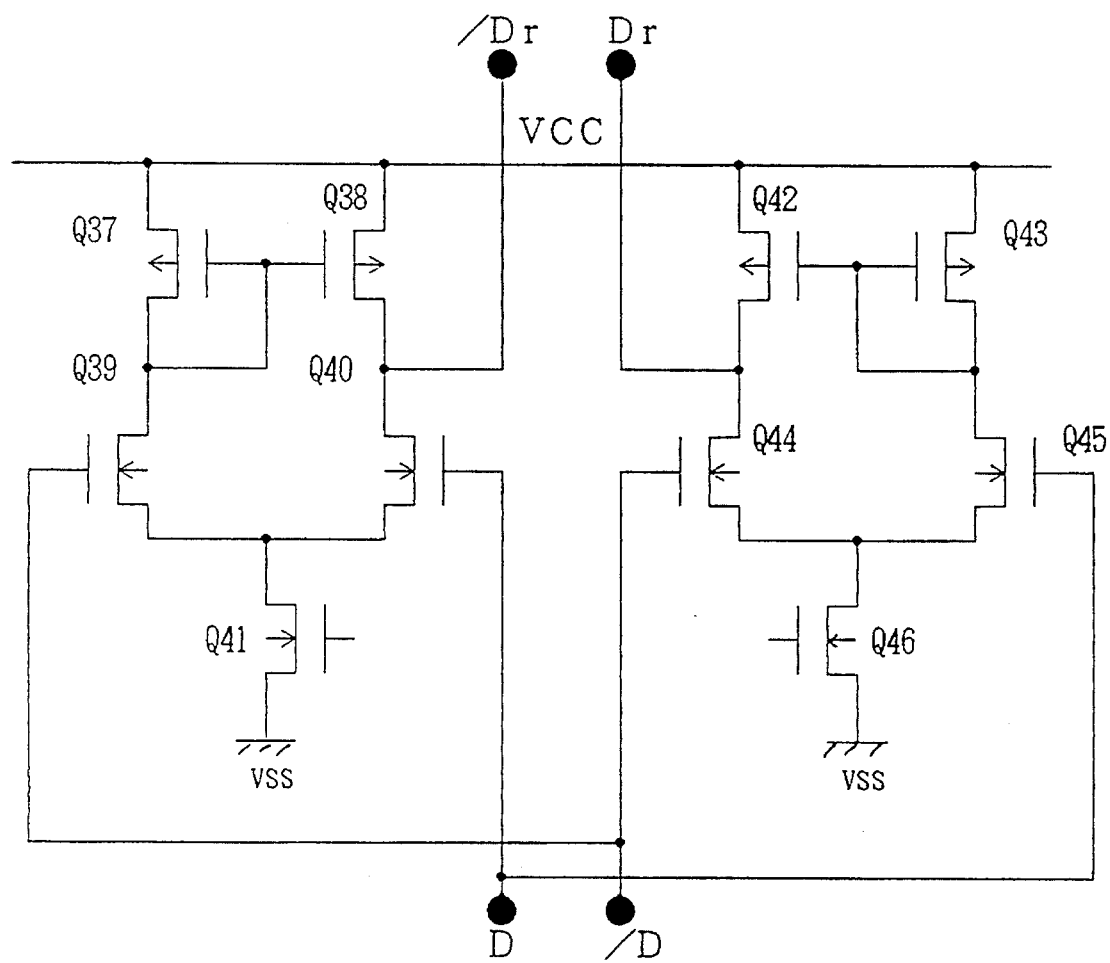
FIG. 26 is a circuit diagram of a sense buffer shown in FIG. 18.

FIG. 26 shows an example of the configuration of the sense buffer 81 shown in FIG. 18. The circuit shown in the figure is a current mirror-type read circuit, which comprises MOS transistors Q37–Q46. The data line D and /D are connected to the gates of the N-channel MOS transistors Q40 and Q44, respectively. Read data Dr and /Dr are obtained from the connection node between the transistors Q42 and Q44 and the connection node between the transistors Q38 and Q40, respectively.

Figure 27:
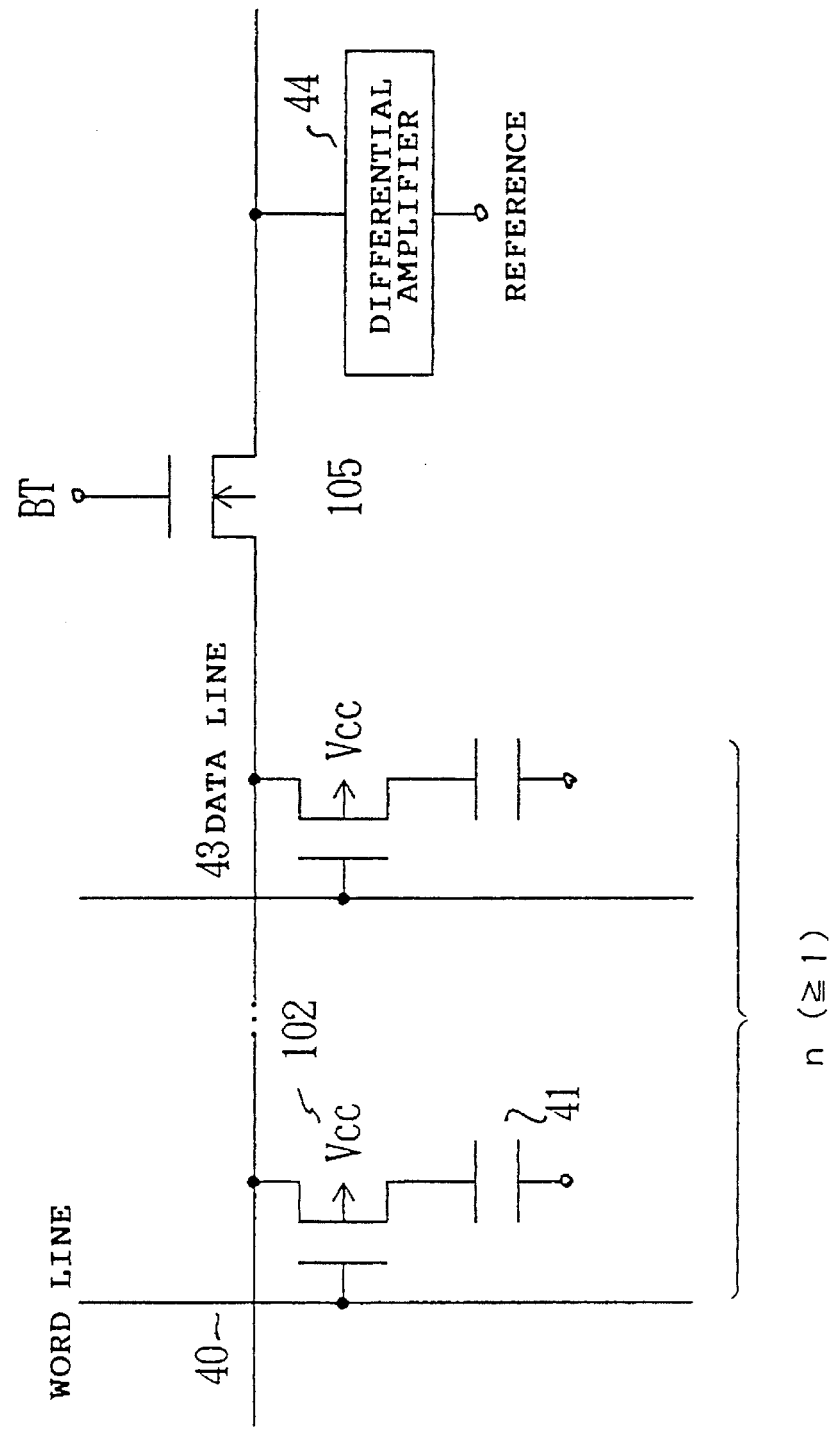
FIG. 27 is a circuit diagram of a second embodiment of the present invention.

FIG. 27 shows the constitution of a second embodiment of the present invention. In FIG. 27, parts that are the same as those shown in FIG. 5 are given the same reference numbers as previously. The second embodiment of the present invention differs from the first embodiment of the present invention in the following respects. First, the second embodiment uses a depletion-type P-channel MOS transistor 102 in place of the depletion-type N-channel MOS transistor 42. Second, the BT gate used in the second embodiment is an N-channel MOS transistor 105 used instead of the P-channel MOS transistor 45.

The depletion-type P-channel MOS transistor 102 has a positive threshold voltage Vthp (see FIG. 6B). When data "0" is written, the N-channel MOS transistor 105 outputs VSS to a bit line, enabling the setting of the source of transistor 102 to VSS. Therefore, if the potential of the word line 40 is not less than the threshold voltage Vthp of the cell transistor 102, the voltage VSS can be written into the cell transistor 102.

When data "1" is written, the N-channel MOS transistor 105 sets the potential of data lines 43 to VCC–Vthn. Thus, by setting the back-gate voltage of transistor 102 to VCC, it becomes possible to apply a reverse voltage to the source and drain diffusion layers. Hence, the circuit configuration shown in FIG. 27 does not require a special back-gate voltage generator.

Even in the second embodiment of the present invention, it is necessary for the condition |Vthn|≧|Vthp| to be met (Vthp denotes the threshold voltage of the cell transistor, and Vthn is the threshold voltage of the BT gate) as in the case where the condition |Vthp|≧|Vthn| is satisfied in the first embodiment of the present invention. A DRAM device can be configured using the circuit configuration shown in FIG. 27.

It is to be noted that various circuit configurations other than the specifically described configurations can be used to form the structural parts shown in FIG. 18.

According to the present invention, it is possible to provide a semiconductor memory device capable of operating at high speeds on fewer internal power supplies.

The present invention is not limited to the specifically disclosed embodiments, and variations and modifications may be made without departing from the scope of the present invention.

What is claimed is:

1. A semiconductor memory device comprising:

memory cells each having a depletion-type field effect transistor and a capacitor connected in series;

a bit line connected to said memory cells;

amplifier means for amplifying the potential of the bit line; and voltage limiting means, including an enhancement-type field effect transistor, for limiting a voltage applied to the bit line by the amplifier means by a predetermined value.

2. The semiconductor memory device as claimed in claim 1, wherein an absolute value of said predetermined value is equal to or greater than a threshold voltage of said depletion-type field effect transistor.

3. The semiconductor memory device as claimed in claim 1, wherein:

said depletion-type field effect transistor is of an N-channel type; and the voltage limiting means comprises a P-channel field effect transistor.

4. The semiconductor memory device as claimed in claim 1, wherein the depletion-type field effect transistor has a gate which receives a select signal having a voltage equal to the voltage applied to the bit line when the memory cells are connected to the bit line.

5. The semiconductor memory device as claimed in claim 1, wherein said voltage limiting means comprises means for limiting the voltage applied to the bit line by said predetermined value.

6. The semiconductor memory device as claimed in claim 1, wherein the voltage applied to the bit line is equal to a ground potential, and said depletion-type field effect transistor comprises a substrate set to the ground potential.

7. The semiconductor memory device as claimed in claim 1, wherein:

said depletion-type field effect transistor is of a P-channel type; and said voltage limiting means comprises an N-type field effect transistor.

8. The semiconductor memory device as claimed in claim 1, wherein the depletion-type field effect transistor has a gate which receives a select signal equal to the voltage applied to the bit line when the memory cells are connected to the bit line.

9. The semiconductor memory device as claimed in claim 1, wherein said voltage limiting means comprises means for limiting the voltage applied to the bit line by said predetermined value.

10. The semiconductor memory device as claimed in claim 1, wherein the voltage applied to the bit line is equal to a ground potential, and said depletion-type field effect transistor comprises a substrate set to the ground potential.

11. The semiconductor memory device as claimed in claim 3, wherein the P-channel field effect transistor of said voltage limiting means has a threshold voltage equal to or higher than a threshold voltage of the depletion-type field effect transistor.

12. The semiconductor memory device as claimed in claim 7, wherein said N-channel field effect transistor has a threshold voltage equal to or higher than a threshold voltage of the depletion-type field effect transistor.

13. The semiconductor memory device as claimed in claim 1, wherein the depletion-type field effect transistor has a gate receiving a voltage equal to or lower than the voltage applied to the bit line when the depletion-type field effect transistor is not selected.

14. The semiconductor memory device as claimed in claim 1, further comprising sense amplifier means for sensing the potential of the bit line via the voltage limiting means.

15. The semiconductor memory device as claimed in claim 1, wherein:

the semiconductor memory device further comprises switch means for selectively connecting the memory cells to the bit line; and said voltage limiting means limits either a first voltage or a second voltage applied to the bit line by the amplifier means by a predetermined value and for applying a limited voltage thus generated to the switch means, the first voltage being higher than the second voltage.

16. A semiconductor memory device, comprising:

memory cells each having a depletion-type field effect transistor and a capacitor connected in series;

a bit line connected to said memory cells;

amplifier means for amplifying the potential of the bit line; and voltage limiting means for limiting one of a relatively high potential and a relatively low potential applied to the bit line by the amplifier means by a predetermined value.

* * * * *